United States Patent
Makita

(10) Patent No.: US 11,817,467 B2
(45) Date of Patent: Nov. 14, 2023

(54) SOLID-STATE IMAGING DEVICE AND ELECTRONIC DEVICE

(71) Applicant: SONY SEMICONDUCTOR SOLUTIONS CORPORATION, Kanagawa (JP)

(72) Inventor: Yoshihiro Makita, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 402 days.

(21) Appl. No.: 17/283,147

(22) PCT Filed: Sep. 12, 2019

(86) PCT No.: PCT/JP2019/035824
§ 371 (c)(1),
(2) Date: Apr. 6, 2021

(87) PCT Pub. No.: WO2020/079997
PCT Pub. Date: Apr. 23, 2020

(65) Prior Publication Data
US 2021/0391367 A1 Dec. 16, 2021

(30) Foreign Application Priority Data
Oct. 15, 2018 (JP) .................... 2018-194269

(51) Int. Cl.
*H01L 27/146* (2006.01)
*H01L 23/13* (2006.01)
*H01L 23/00* (2006.01)

(52) U.S. Cl.
CPC ........ *H01L 27/14618* (2013.01); *H01L 23/13* (2013.01); *H01L 24/32* (2013.01);
(Continued)

(58) Field of Classification Search
CPC . H01L 2224/32057; H01L 2224/32237; H01L 2224/73204; H01L 23/13;
(Continued)

(56) References Cited

U.S. PATENT DOCUMENTS 9,627,229 B2 * 4/2017 Lan .................. H01L 21/563
11,121,112 B2 * 9/2021 Fujimagari ............ H01L 24/81
(Continued)

FOREIGN PATENT DOCUMENTS

JP  2002-124654  4/2002
JP  2013-030526  2/2013
(Continued)

OTHER PUBLICATIONS

English translation of European Search Report for PCT/JP2019/035824 (Year: 2021).*
(Continued)

*Primary Examiner* — Telly D Green
(74) *Attorney, Agent, or Firm* — Sheridan Ross PC

(57) ABSTRACT

In a solid-state imaging device, a material forming an underfill part is prevented from flowing toward a side of a pixel region, shortening of a distance between an end portion of an opening of a substrate and the pixel region is enabled, and miniaturization is promoted. The device includes: an imaging element having a pixel region including a large number of pixels on one plate surface of a semiconductor substrate; a substrate provided on the surface side with respect to the imaging element and having an opening for passing light to be received by the pixel region; and an underfill part including a cured fluid and covering a connection part that electrically connects the imaging element and the substrate, in which the substrate has a groove for guiding the fluid forming the underfill part in a direction away from the surface of the imaging element.

5 Claims, 16 Drawing Sheets

(52) U.S. Cl.
CPC ........ *H01L 24/73* (2013.01); *H01L 27/14636* (2013.01); *H01L 2224/32057* (2013.01); *H01L 2224/32237* (2013.01); *H01L 2224/73204* (2013.01)

(58) Field of Classification Search
CPC ... H01L 24/32; H01L 24/73; H01L 27/14618; H01L 27/14625; H01L 27/14636; H04N 23/54
See application file for complete search history.

(56) References Cited

U.S. PATENT DOCUMENTS

| | | |
|---|---|---|
| 2002/0044213 A1 | 4/2002 | Shinomiya et al. |
| 2004/0095501 A1 | 5/2004 | Aizawa |
| 2013/0026591 A1 | 1/2013 | Iwafuchi |
| 2018/0211989 A1 | 7/2018 | Hogyoku et al. |
| 2018/0269122 A1 * | 9/2018 | Kato ................... H01L 24/83 |

FOREIGN PATENT DOCUMENTS

| | | | | |
|---|---|---|---|---|
| WO | WO-2016203967 A1 * | 12/2016 | ........... | H01L 21/563 |
| WO | WO 2017/014072 | 1/2017 | | |

OTHER PUBLICATIONS

International Search Report prepared by the Japan Patent Office dated Nov. 14, 2019, for International Application No. PCT/JP2019/035824.

* cited by examiner

FIG. 9
A
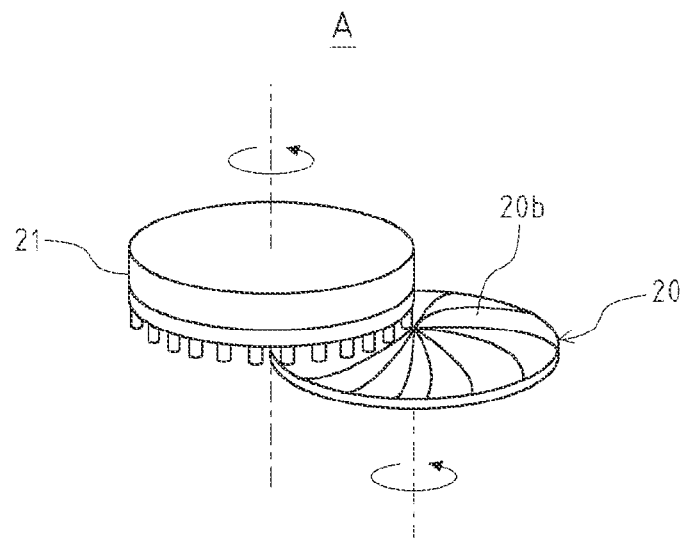
B
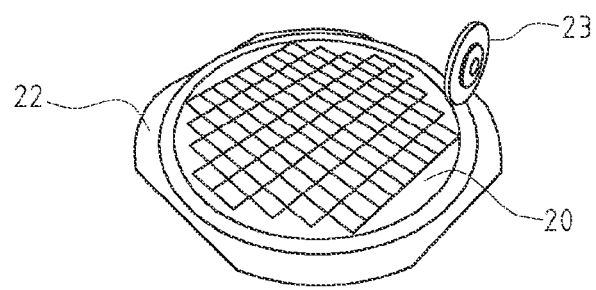
C
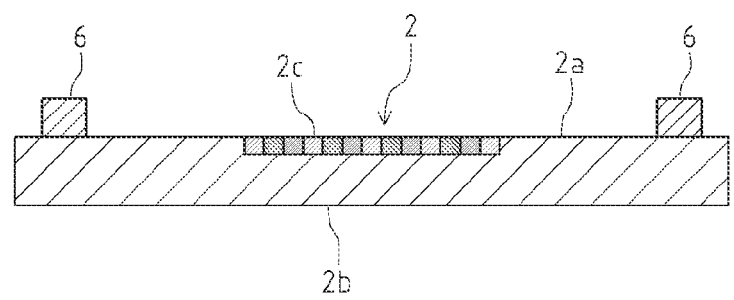

FIG. 20
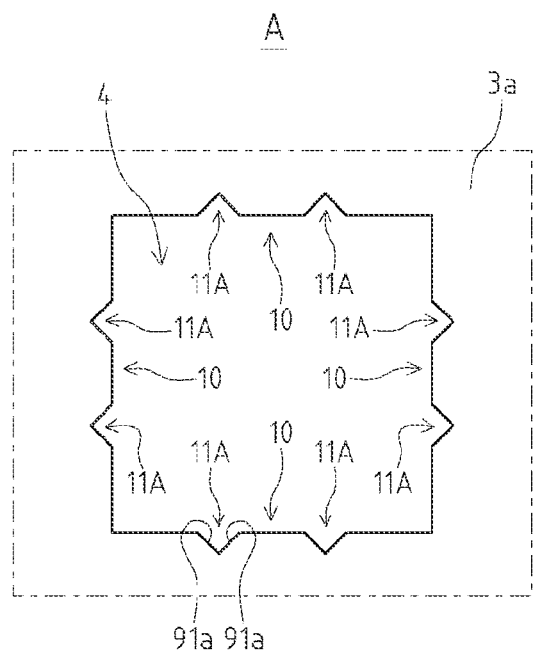
A
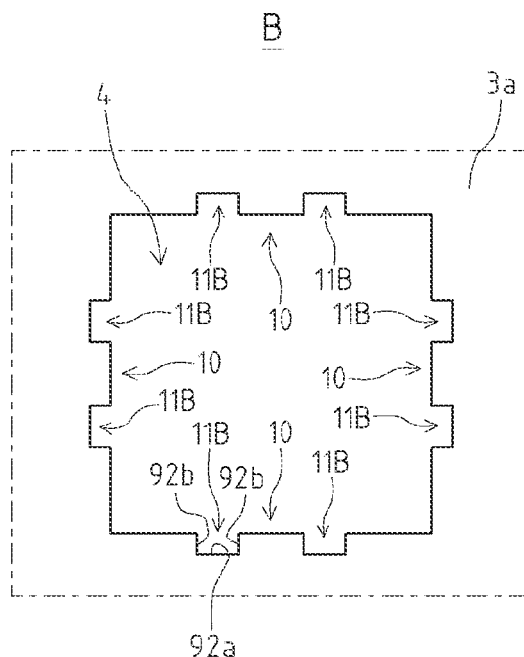
B
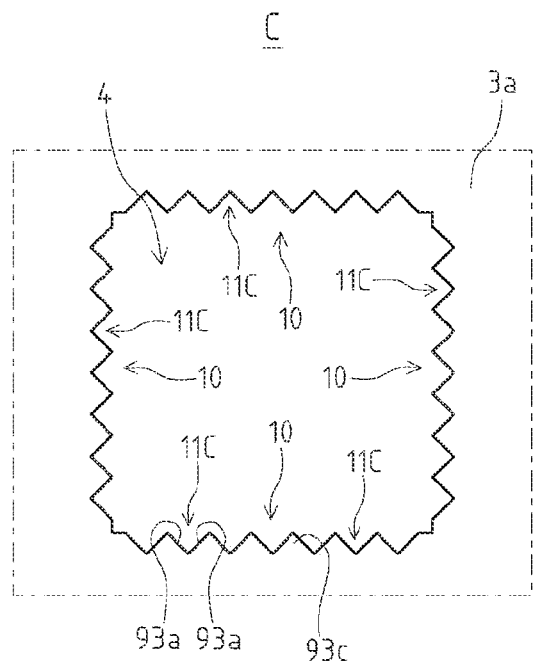
C
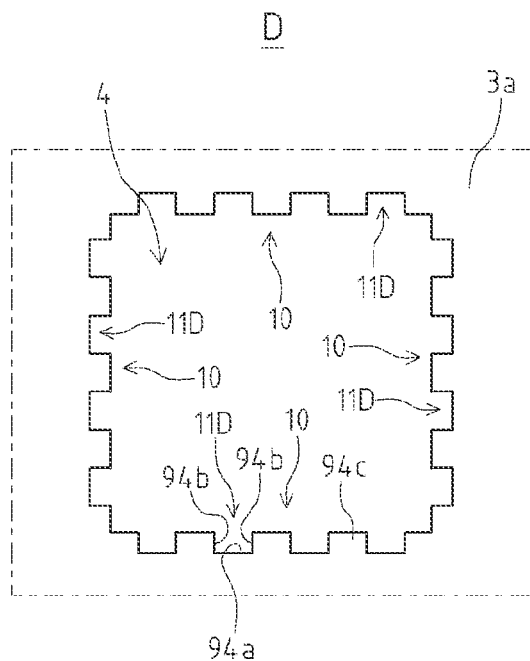
D

FIG. 21
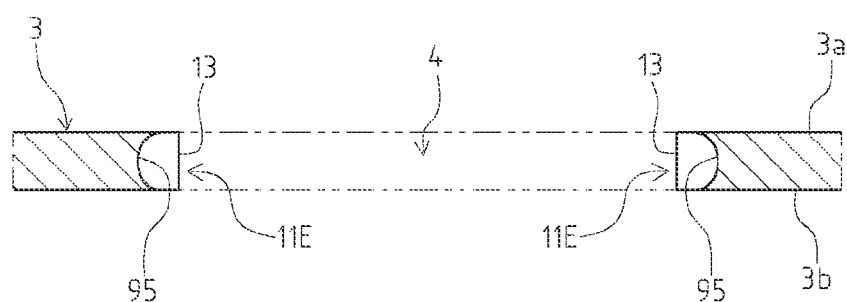
A
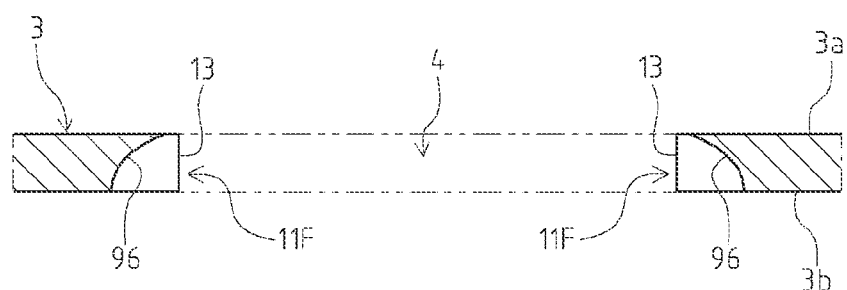
B
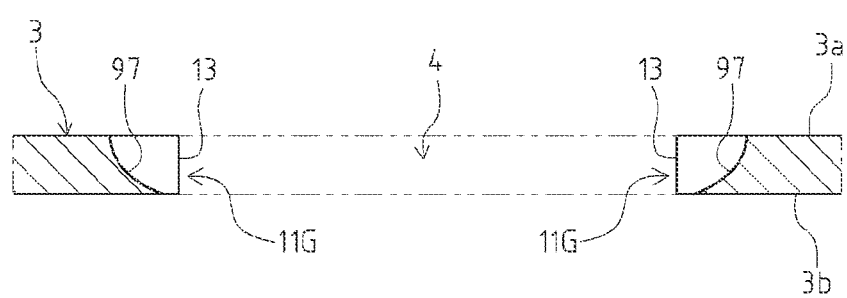
C

SOLID-STATE IMAGING DEVICE AND ELECTRONIC DEVICE

CROSS REFERENCE TO RELATED APPLICATIONS

This application is a national stage application under 35 U.S.C. 371 and claims the benefit of PCT Application No. PCT/JP2019/035824 having an international filing date of 12 Sep. 2019, which designated the United States, which PCT application claimed the benefit of Japanese Patent Application No. 2018-194269, filed 15 Oct. 2018, the entire disclosures of each of which are incorporated herein by reference.

TECHNICAL FIELD

The present technology relates to a solid-state imaging device and an electronic device.

BACKGROUND ART

Some solid-state imaging devices having an image sensor as a solid-state imaging element have a so-called flip-chip structure in which an image sensor and a substrate are electrically connected via a connection part such as a bump which is a protruding terminal. The substrate is, for example, a substrate that is formed including a material such as an organic material or ceramics, is provided with a wiring layer, electrodes, or the like, and has an opening for passing light to be received by the image sensor. A translucent member such as glass is provided on the side of the substrate opposite to the image sensor side so as to cover the opening of the substrate, and a package structure in which a hollow portion is formed on the light receiving surface side of the image sensor is configured.

In the flip-chip structure, an underfill part is provided between the substrate and the image sensor for the purpose of protecting or reinforcing the connection part such as a bump. The underfill part is, for example, a portion formed by curing a paste-like or liquid resin which is a fluid. Some underfill parts are of a capillary flow type (capillary underfill) formed by causing a liquid resin having a relatively low viscosity to flow by using a capillary phenomenon.

In the flip-chip structure having an underfill part, there is a problem that a liquid resin before curing (hereinafter referred to as "underfill material") forming the underfill part reaches a pixel region which is the light receiving region of the image sensor, and adversely affects the characteristics of the image sensor. A technology for such a problem is disclosed, for example, in Patent Document 1.

Patent Document 1 discloses a technology of, in order to prevent an underfill material from reaching a pixel region of an image sensor, securing a dimension of a distance from an opening end portion of an opening of a substrate and an end portion of the pixel region of the image sensor on the basis of a dimension of a gap between plate surfaces of the substrate and the image sensor. Furthermore, Patent Document 1 discloses a configuration in which, on the image sensor, an embankment portion or a groove is provided in a portion between the opening end portion of the opening of the substrate and the pixel region, that is, a portion in front of the pixel region in the flow of the underfill material, so that the flow of the resin to the pixel region side is stopped.

CITATION LIST

Patent Document

Patent Document 1: Japanese Patent Application Laid-Open No. 2002-124654

SUMMARY OF THE INVENTION

Problems to be Solved by the Invention

Certainly, according to the conventional technology as disclosed in Patent Document 1, it is conceivable that an underfill material can be prevented from reaching a pixel region. However, according to the conventional technology, there are problems as below.

First, as described above, the technology of securing the dimension of the distance between the opening end portion of the opening of the substrate and the end portion of the pixel region of the image sensor is based on the premise that the underfill material expands toward the pixel region, and is to secure an area that allows the expansion. Therefore, such a technology hinders the miniaturization of the image sensor and the package structure. Furthermore, as described above, the configuration in which the embankment portion or the groove is provided in the portion in front of the pixel region on the image sensor also hinders miniaturization because it is necessary to secure a space for providing the embankment portion or the groove in the image sensor.

In recent years, image sensors have tended to be Staked Die, and therefore, miniaturization of image sensor chips has been advanced. The miniaturization of the image sensor contributes to cost reduction. However, according to the prior art, it is difficult to bring the distance between the opening end portion of the opening of the substrate and the pixel region close from the viewpoint of preventing the underfill material from reaching the pixel region, which hinders the miniaturization of the image sensor.

An object of the present technology is to provide a solid-state imaging device and an electronic device capable of preventing a material forming an underfill part from flowing toward a side of a pixel region of a solid-state imaging element, shortening a distance between an opening end portion of an opening of a substrate and the pixel region, and promoting miniaturization of the solid-state imaging element and the device.

Solutions to Problems

A solid-state imaging device according to the present technology includes: a solid-state imaging element having a pixel region which is a light receiving region including a large number of pixels on a surface side which is one plate surface of a semiconductor substrate; a substrate provided on the surface side with respect to the solid-state imaging element and having an opening for passing light to be received by the pixel region; and an underfill part formed including a cured fluid and covering a connection part that electrically connects the solid-state imaging element and the substrate, in which the substrate has a groove for guiding the fluid forming the underfill part in a direction away from the surface of the solid-state imaging element, on a surface portion forming the opening.

Another aspect of the solid-state imaging device according to the present technology is the solid-state imaging device in which the groove is formed by a semi-cylindrical concave curved surface.

Another aspect of the solid-state imaging device according to the present technology is the solid-state imaging device in which the groove is inclined in a direction in which an opening width of the opening is narrowed from a side of the solid-state imaging element to the opposite side with respect to a plate thickness direction of the substrate.

Another aspect of the solid-state imaging device according to the present technology is the solid-state imaging device in which the groove is inclined in a direction in which an opening width of the opening is widened from a side of the solid-state imaging element to the opposite side with respect to a plate thickness direction of the substrate.

An electronic device according to the present technology includes a solid-state imaging device, the solid-state imaging device including: a solid-state imaging element having a pixel region which is a light receiving region including a large number of pixels on a surface side which is one plate surface of a semiconductor substrate; a substrate provided on the surface side with respect to the solid-state imaging element and having an opening for passing light to be received by the pixel region; and an underfill part formed including a cured fluid and covering a connection part that electrically connects the solid-state imaging element and the substrate, in which the substrate has a groove for guiding the fluid forming the underfill part in a direction away from the surface of the solid-state imaging element, on a surface portion forming the opening.

Effects of the Invention

According to the present technology, it is possible to prevent a material forming an underfill part from flowing toward a side of a pixel region of a solid-state imaging element, shorten a distance between an opening end portion of an opening of a substrate and the pixel region, and promote miniaturization of the solid-state imaging element and the device.

BRIEF DESCRIPTION OF DRAWINGS

FIG. 9 is an explanatory diagram of a method of manufacturing the solid-state imaging device according to the first embodiment of the present technology.

FIG. 20 is a diagram showing a modification of a groove of a substrate according to the embodiment of the present technology.

FIG. 21 is a diagram showing a modification of a groove of a substrate according to the embodiment of the present technology.

MODE FOR CARRYING OUT THE INVENTION

Figure 1:
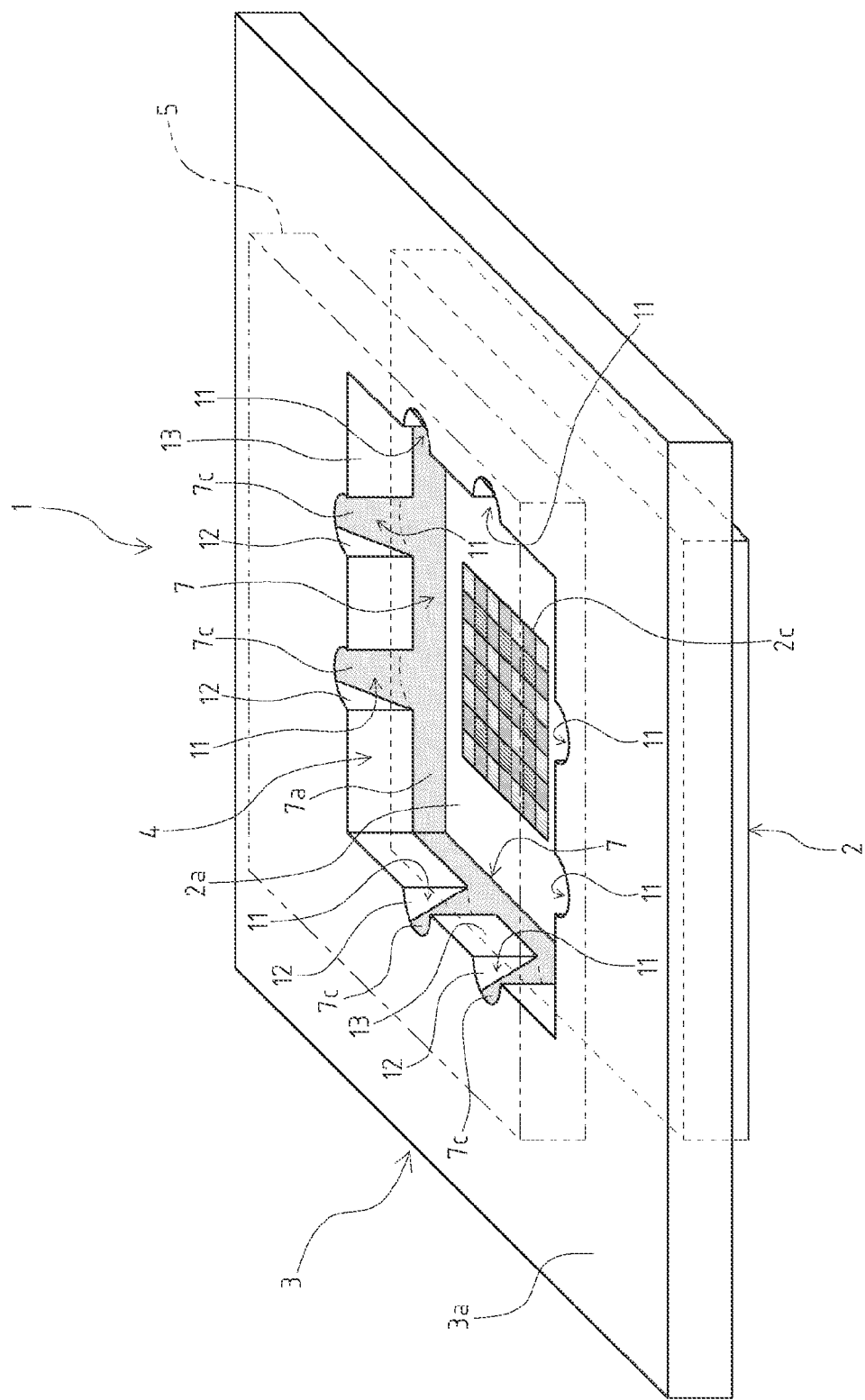
FIG. 1 is a perspective view showing a configuration of a solid-state imaging device according to a first embodiment of the present technology.
Figure 2:
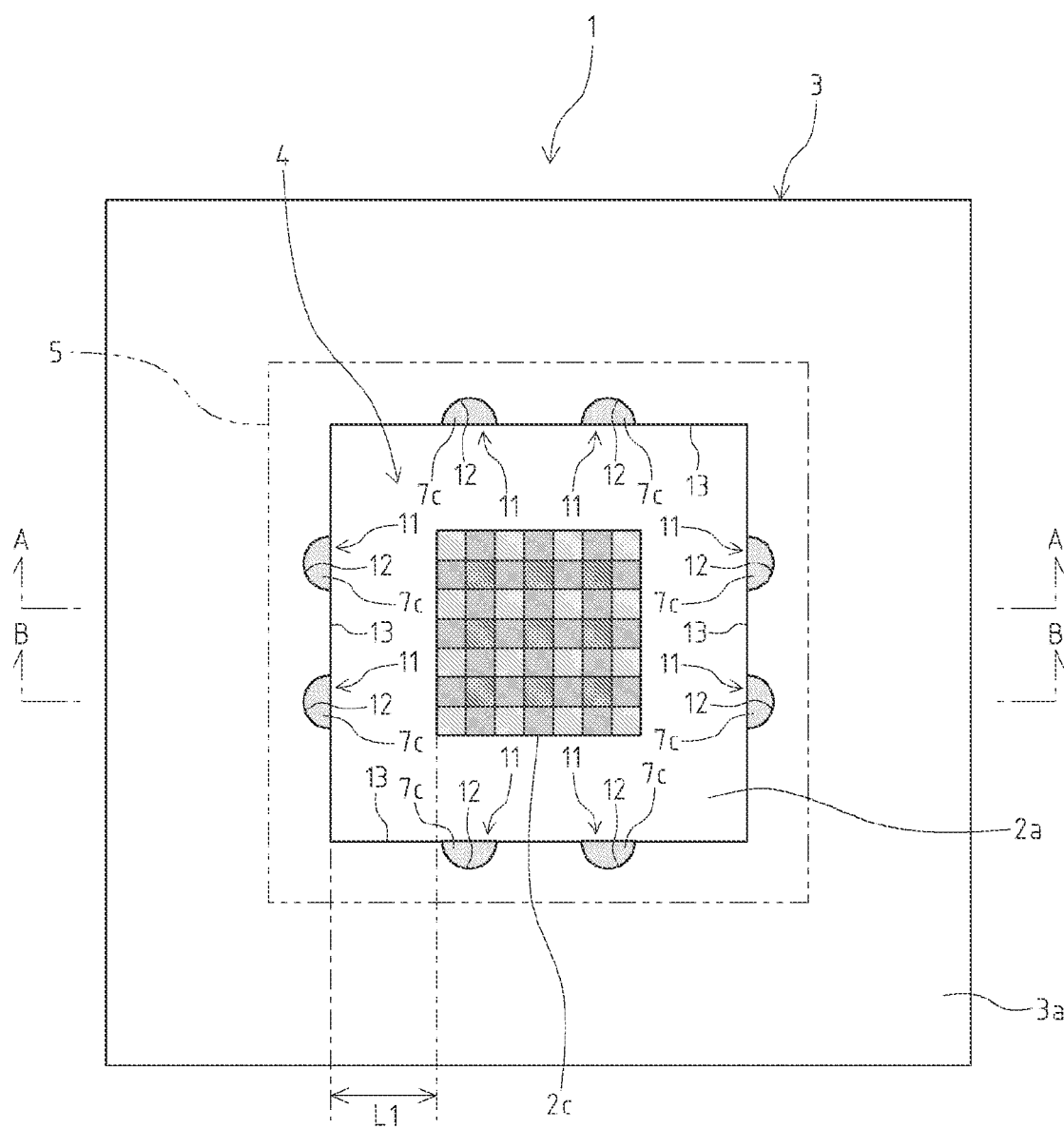
FIG. 2 is a plan view showing the configuration of the solid-state imaging device according to the first embodiment of the present technology.
Figure 3:
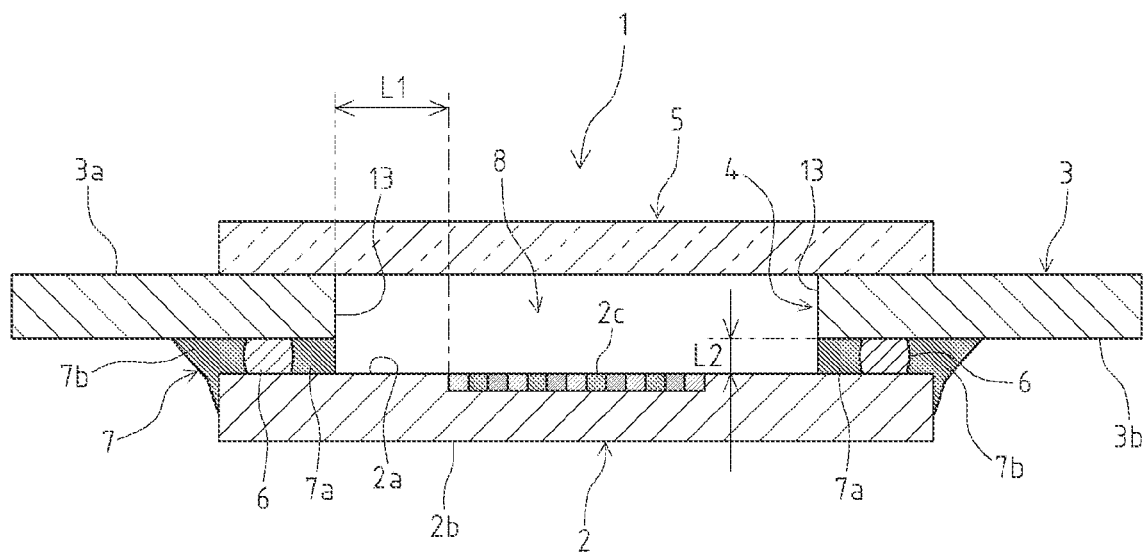
FIG. 3 is an end view of the A-A line cut portion in FIG. 2.
Figure 4:
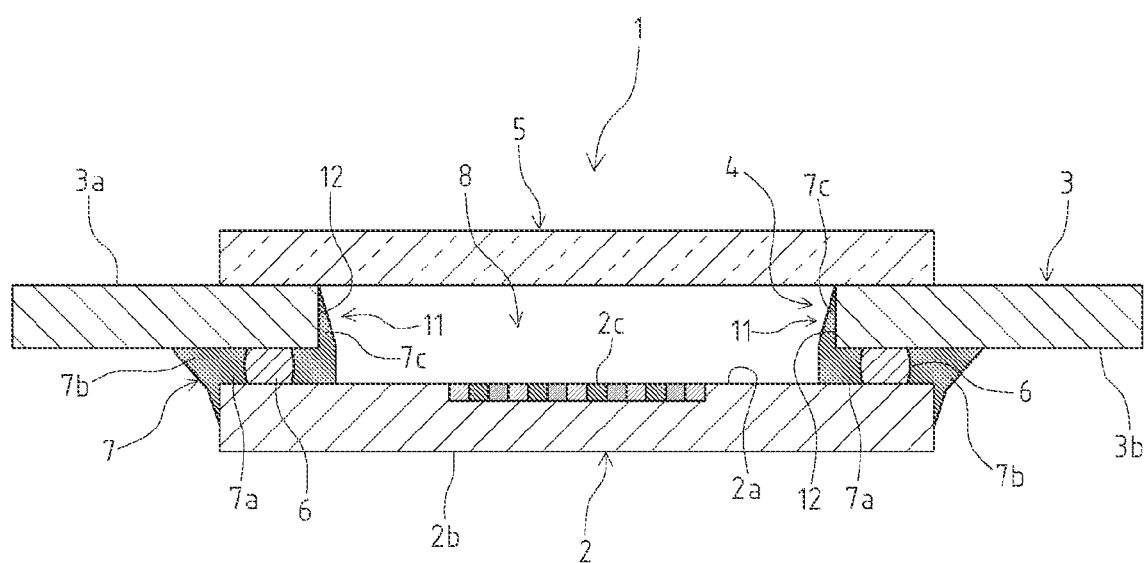
FIG. 4 is an end view of the B-B line cut portion in FIG. 2.
Figure 5:
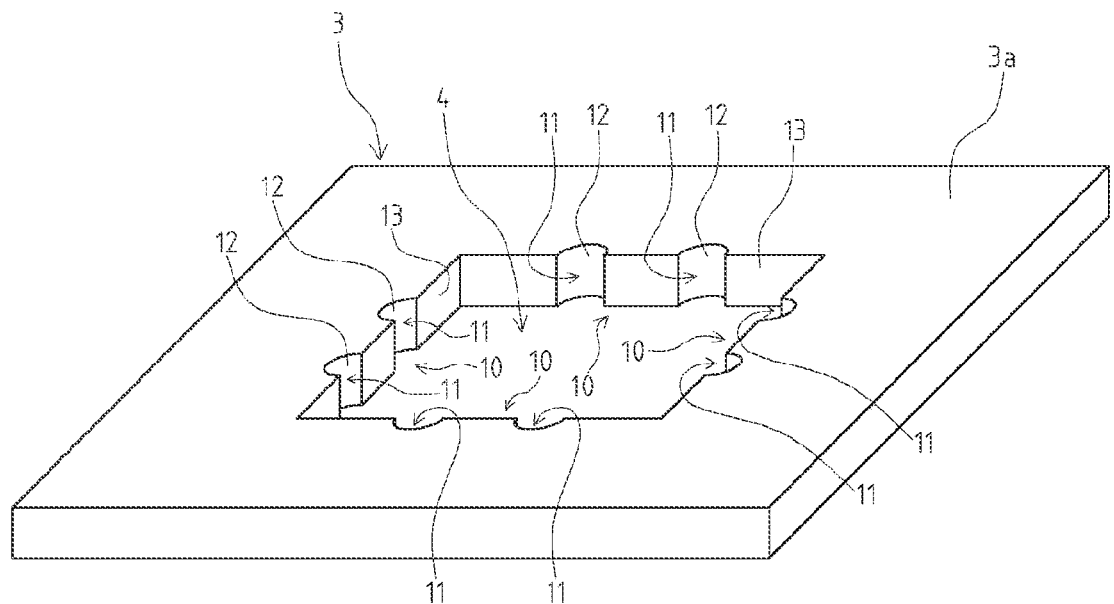
FIG. 5 is a perspective view showing a configuration of a substrate according to the first embodiment of the present technology.
Figure 6:
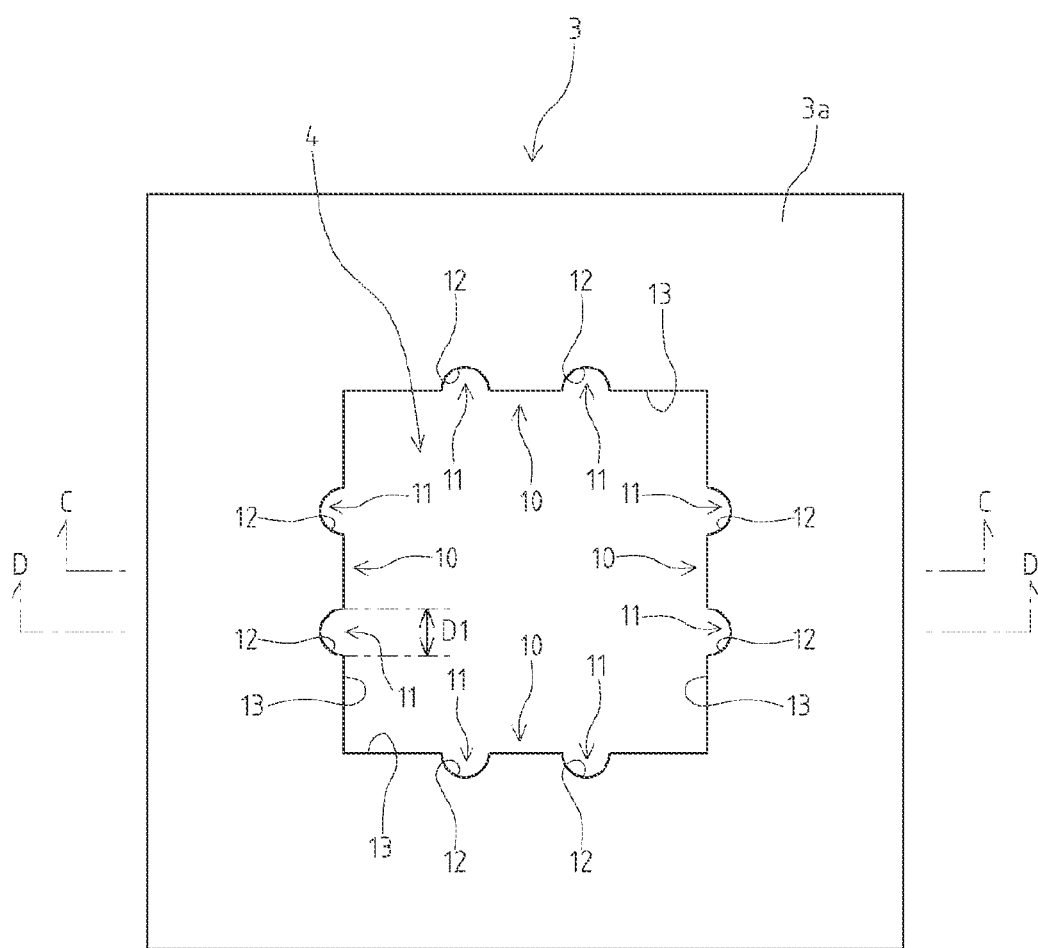
FIG. 6 is a plan view showing the configuration of the substrate according to the first embodiment of the present technology.
Figure 7:
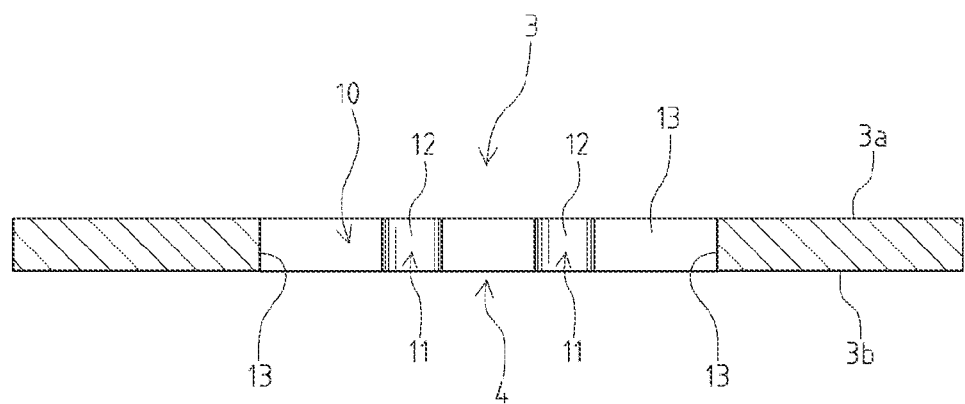
FIG. 7 is a cross-sectional view taken along the line C-C in FIG. 6.
Figure 8:
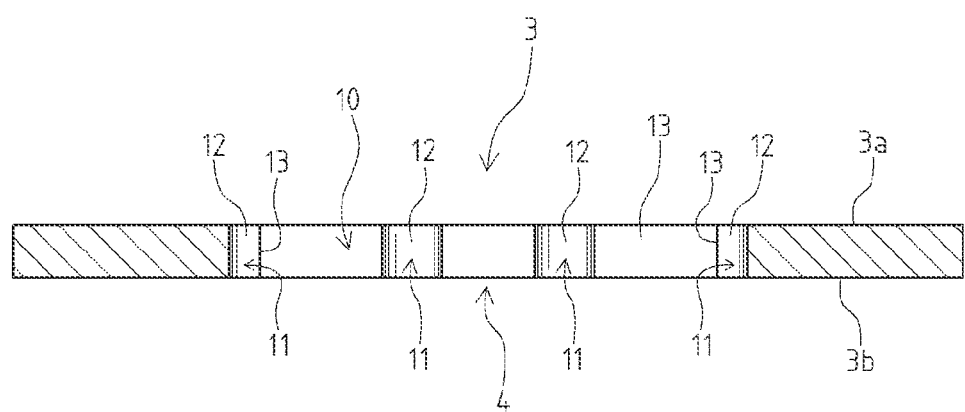
FIG. 8 is a cross-sectional view taken along the line D-D in FIG. 6.

The present technology is intended to devise the shape of a surface forming an opening of a substrate in a configuration in which an underfill part covering a connection part that electrically connects a solid-state imaging element and the substrate having an opening for passing light to be received by the solid-state imaging element, to suppress a fluid forming the underfill part from flowing toward a pixel region of the solid-state imaging element.

Embodiments for implementing the present technology (hereinafter, referred to as "embodiments") will be described below with reference to the drawings. Note that the embodiments will be described in the following order.

1. Configuration example of solid-state imaging device according to the first embodiment
2. Manufacturing method of solid-state imaging device according to the first embodiment
3. Configuration example of solid-state imaging device according to the second embodiment
4. Configuration example of solid-state imaging device according to the third embodiment
5. Modification of groove of substrate
6. Configuration example of electronic device <Configuration Example of Solid-State Imaging Device According to the First Embodiment>

A configuration example of a solid-state imaging device 1 according to a first embodiment of the present technology will be described with reference to FIGS. 1 to 8. As shown in FIG. 1, the solid-state imaging device 1 includes an image sensor 2 as a solid-state imaging element, a substrate 3 on which an opening 4 for passing light to be received by the image sensor 2 is formed, and a glass 5 as a translucent member supported on the substrate 3. Furthermore, the solid-state imaging device 1 includes a metal bump 6 which is a connection part that electrically connects the image sensor 2 and the substrate 3, and an underfill part 7 covering the metal bump 6. Note that, in FIGS. 1 and 2, the glass 5 is shown by a chain double-dashed line for convenience.

The solid-state imaging device 1 has a so-called flip-chip structure in which the image sensor 2 and the substrate 3 are electrically connected via a plurality of metal bumps 6. In the solid-state imaging device 1, the glass 5 is mounted so as to cover the opening 4 on the side opposite to the image sensor 2 of the substrate 3, and the solid-state imaging device 1 has a package structure in which a cavity 8 which is a closed space including an internal space of the opening 4 of the substrate 3 is provided between the image sensor 2 and the glass 5.

The image sensor 2 includes a silicon semiconductor substrate including silicon (Si), which is an example of a semiconductor, and one plate surface side (upper side in FIG. 1) of the semiconductor substrate is a light receiving side. The image sensor 2 is a rectangular plate-shaped chip, and a plate surface on the light receiving side is a front surface $2a$, and a plate surface on the opposite side is a back surface $2b$. The image sensor 2 according to the present embodiment is a complementary metal oxide semiconductor (CMOS) type image sensor. However, the image sensor 2 may be a charge coupled device (CCD) type image sensor.

Most of the image sensor 2 is configured by a semiconductor substrate, and an image sensor element is formed on the surface $2a$ side. The image sensor 2 has a pixel region $2c$ as a light receiving part on the surface $2a$ side, which is a light receiving region including a large number of pixels formed in a predetermined array such as a Bayer array, and a region around the pixel region $2c$ is a peripheral region. The pixel region $2c$ includes an effective pixel region for generating, amplifying, and reading a signal charge by photoelectric conversion in each pixel.

The pixel in the pixel region $2c$ has a photodiode as a photoelectric conversion unit having a photoelectric conversion function, and a plurality of pixel transistors. The photodiode has a light receiving surface that receives light incident from the surface $2a$ side of the image sensor 2, and generates a signal charge in an amount corresponding to the light amount (intensity) of the light incident on the light receiving surface. The plurality of pixel transistors includes, for example, MOS transistors that are responsible for amplifying, transferring, selecting, and resetting the signal charges generated by the photodiode. Note that, regarding the plurality of pixels, the photodiode and the transfer transistor included in the plurality of unit pixels may have a shared pixel structure configured by sharing the other pixel transistor.

On the surface $2a$ side of the image sensor 2, a color filter and an on-chip lens are formed correspondingly to each pixel via an antireflection film including an oxide film or the like or a planarizing film including an organic material, with respect to the semiconductor substrate. The light incident on the on-chip lens is received by the photodiode through a color filter, a planarizing film, or the like.

Examples of the configuration of the image sensor 2 include a configuration of a front side illumination type in which the pixel region $2c$ is formed on the surface side of the semiconductor substrate, a configuration of a back side illumination type in which a photodiode or the like is arranged in reverse and the back side of the semiconductor substrate is the light receiving surface side in order to improve light transmission, and a configuration as one chip in which peripheral circuits of pixel groups are stacked. However, the image sensor 2 according to the present technology is not limited to those having these configurations.

The substrate 3 is provided on the surface $2a$ side with respect to the image sensor 2, and has the opening 4 for passing light to be received by the pixel region $2c$ of the image sensor 2. The substrate 3 has a rectangular plate-like outer shape as a whole, and has a front surface $3a$ which is one plate surface and a back surface $3b$ which is the other plate surface on the opposite side. The substrate 3 is, for example, a substrate formed including a material such as an organic material such as a plastic or ceramics provided with a wiring layer, electrodes, or the like.

The substrate 3 is provided parallel to the image sensor 2 and has the opening 4 at the center of the plate surface. The opening 4 has a substantially rectangular opening shape corresponding to the rectangular outer shape of the substrate 3, and is formed in a penetrating shape from the front surface $3a$ to the back surface $3b$ of the substrate 3. Therefore, the substrate 3 has a frame-like shape as a whole, and the rectangular opening 4 is formed by four side portions forming the frame shape. The opening 4 is formed by four inner side surface portions 10 having a substantially rectangular shape in a plan view.

With respect to such a substrate 3, the image sensor 2 is provided on the back surface $3b$ side of the substrate 3 with the light receiving surface facing the front surface $3a$ side of the substrate 3 from the opening 4. The image sensor 2 has an outer shape larger than that of the opening 4 of the substrate 3, and is provided so as to close the opening 4 from below with respect to the substrate 3. The opening 4 is formed so that the entire pixel region $2c$ of the image sensor 2 is located within the opening range of the opening 4 in a plan view.

That is, the pixel region $2c$ is formed as a rectangular region corresponding to the outer shape of the image sensor 2 in a plan view, and each side forming the outer edge of the pixel region $2c$ is located inside the inner side surface portion 10 forming the opening 4 in a plan view. In other words, in a plan view, there is a distance L1 between each inner side surface portion 10 forming the opening 4 and each side forming the outer edge of the pixel region $2c$ located in the opening 4 (see FIGS. 2 and 3).

The metal bump 6 is interposed between the front surface $2a$ of the image sensor 2 and the back surface $3b$ of the substrate 3, and electrically connects the image sensor 2 and the substrate 3 to each other. The metal bump 6 is a protruding terminal, and for example, electrically connects an electrode formed on the front surface $2a$ of the image sensor 2 and a wiring layer formed on the back surface $3b$ of the substrate 3. Due to the presence of the metal bump 6 between the image sensor 2 and the substrate 3, a gap is formed between the front surface $2a$ of the image sensor 2 and the back surface $3b$ of the substrate 3. A dimension L2 of this gap (see FIG. 3) is, for example, about 20 µm.

A plurality of metal bumps 6 is provided, for example, in an array so as to be arranged around the opening 4 at predetermined intervals according to the number of electrodes formed on the surface $2a$ of the image sensor 2. The metal bump 6 is, for example, an Au stud bump, a solder ball bump, or an Au—Ag alloy bump. The metal bump 6 is covered with the underfill part 7.

The underfill part 7 is formed including a resin which is a cured fluid, and covers the metal bump 6 existing between the image sensor 2 and the substrate 3. The underfill part 7 is formed so as to include a plurality of metal bumps 6 between an outer circumferential portion of the image sensor 2 and an inner circumferential portion around the opening 4 of the substrate 3, and is a resin sealing part that seals the gap between the image sensor 2 and the substrate 3. The underfill part 7 is provided between the image sensor 2 and the substrate 3 in the flip-chip structure for the purpose of protecting or reinforcing the metal bump 6 and the connection portion by the metal bump 6.

The underfill part 7 is a liquid curable resin portion formed by curing a paste-like or liquid resin by baking or the like. In the present embodiment, the underfill part 7 is of a capillary flow type (capillary underfill) formed by flowing a liquid resin having a relatively low viscosity by using a capillary phenomenon.

As the material of the underfill part 7, for example, a resin material used as a molding material is used. Specifically, as the material of the underfill part 7, for example, a thermosetting resin such as an epoxy resin or a thermosetting resin in which a filler containing a silicon oxide as a main component is dispersed is used.

The liquid resin material (for example, thermosetting resin, hereinafter referred to as "underfill material") serving as the underfill part 7 is applied so as to flow by the capillary phenomenon while being discharged from a nozzle of a dispenser, and cover the entire plurality of metal bumps 6 provided in an array, and fill the gap between the image sensor 2 and the substrate 3. Therefore, in a plan view, the underfill part 7 is formed in a rectangular frame-shaped region corresponding to the shape of the portion where the image sensor 2 and the substrate 3 overlap each other, that is, along the opening shape of the opening 4.

The underfill part 7 has a portion that protrudes from the periphery of the metal bump 6 due to the surface tension of the underfill material, the wettability of the surface on which the underfill material flows, and the like. Specifically, the underfill part 7 has a surface intervening part 7a existing at the opposite portion of the front surface 2a of the image sensor 2 and the back surface 3b of the substrate 3, and an outer protruding part 7b, which is a portion protruding from the surface intervening part 7a to the outer peripheral side of the image sensor 2.

The glass 5 is an example of the transparent member, and is a rectangular plate-shaped member smaller than the substrate 3. By being provided on the substrate 3, the glass 5 is provided on the light receiving side of the image sensor 2 in parallel with the image sensor 2 and at a predetermined interval. The glass 5 is fixed to the surface 3a of the substrate 3 with an adhesive or the like.

The glass 5 is provided so as to cover the entire opening 4 from above with respect to the substrate 3. Therefore, the glass 5 has an external dimension larger than the opening dimension of the opening 4. As described above, the glass 5 is provided above the image sensor 2 so as to face the surface 2a of the image sensor 2 through the opening 4 of the substrate 3.

The glass 5 transmits various types of light incident from an optical system such as a lens located above the glass 5, and transmits the light to the light receiving surface of the image sensor 2 through the cavity 8. The glass 5 has a function of protecting the light receiving surface side of the image sensor 2, and blocking, together with the substrate 3 and the underfill part 7, the intrusion of moisture (water vapor), dust, or the like from the outside into the cavity 8.

Note that, instead of the glass 5, for example, a plastic plate, a silicon plate that transmits only infrared light, or the like can be used.

In the solid-state imaging device 1 having the configuration as described above, the light transmitted through the glass 5 passes through the cavity 8 and is received and detected by the light receiving elements included in each pixel arranged in the pixel region 2c of the image sensor 2.

As described above, the flip-chip structure solid-state imaging device 1 having the underfill part 7 has the configuration as below in order to control the flow of the underfill material in the process of forming the underfill part 7. That is, in the solid-state imaging device 1, the substrate 3 has a groove 11 for guiding a fluid that forms the underfill part 7, that is, an underfill material to the inner side surface portion 10 that is a surface portion forming the opening 4 in the direction away from the surface 2a of the image sensor 2.

The groove 11 is formed as a concave portion with respect to the flat portion of the inner side surface portion 10. That is, the groove 11 is formed by a concave surface 12 on the inner side surface portion 10. Therefore, the inner side surface portion 10 has a flat surface part 13 which is a flat surface perpendicular to the plate surface of the substrate 3 and the concave surface 12 which is a concave surface with respect to the flat surface part 13.

The groove 11 is formed along the vertical direction over the entire plate thickness direction of the substrate 3, that is, perpendicular to the plate surface of the substrate 3. Therefore, the groove 11 has a constant horizontal cross-sectional shape over the entire plate thickness direction (up and down direction) of the substrate 3 by the concave surface 12, and both the front surface 3a side and the back surface 3b side of the substrate 3 are opened.

In the present embodiment, the groove 11 is formed by a semi-cylindrical concave curved surface. That is, the concave surface 12 forming the groove 11 is a semi-cylindrical concave curved surface. Therefore, in a plan view of the substrate 3, the groove 11 forms a semicircular curve due to the concave surface 12 with respect to the linear flat surface part 13.

In the example shown in the drawing, the grooves 11 are provided at two locations at predetermined intervals in each inner side surface portion 10 forming the opening 4. Therefore, the substrate 3 has grooves 11 at eight positions on the surface portion forming the opening 4. In each inner side surface portion 10, the two grooves 11 are provided in a similar arrangement mode. Note that the number of grooves 11 included in the substrate 3 is not limited, and the number and arrangement modes of the grooves 11 in each inner side surface portion 10 may be different.

According to the configuration having the groove 11, a part of the underfill material supplied between the image sensor 2 and the substrate 3 passes through the groove 11 in the process of forming the underfill part 7, and is guided in the direction from the back surface 3b side of the substrate 3 to the surface 3a side, that is, in the direction away from the surface 2a of the image sensor 2. The groove 11 guides the underfill material by capillarity phenomenon. That is, between the image sensor 2 and the substrate 3, the underfill material that has reached the open portion on the lower side of the groove 11 is guided onto the concave surface 12 in a manner of being sucked up by the capillary phenomenon.

By guiding the underfill material to the groove 11 as described above, a portion where the underfill material is cured on the concave surface 12 of the groove 11 exists as a part of the underfill part 7. Therefore, the underfill part 7 has, in addition to the surface intervening part 7a between the front surface 2a of the image sensor 2 and the back surface 3b of the substrate 3 and the outer protruding part 7b, a leading out part 7c having cured underfill material that has been guided into the groove 11.

From the viewpoint of causing the capillary phenomenon due to the groove 11, it is desirable that the diameter D1 (see FIG. 6) of the concave surface 12 which is a semi-cylindrical concave curved surface has a dimension in the range of, for example, 10 to 50 µm. However, the size of the diameter of the concave surface 12 is not particularly limited. Furthermore, from the viewpoint of guiding a larger amount of underfill material, it is desirable that the number of grooves 11 is large.

Furthermore, in the configuration for obtaining the guiding action of the underfill material by the groove 11, it is desirable that the height of the metal bump 6 is about 20 µm, for example. Furthermore, it is desirable that the viscosity of the underfill material is 20 Pa·s or less at room temperature, and more desirably about 10 Pa·s at room temperature.

<2. Manufacturing Method of Solid-State Imaging Device According to the First Embodiment>

Figure 10:
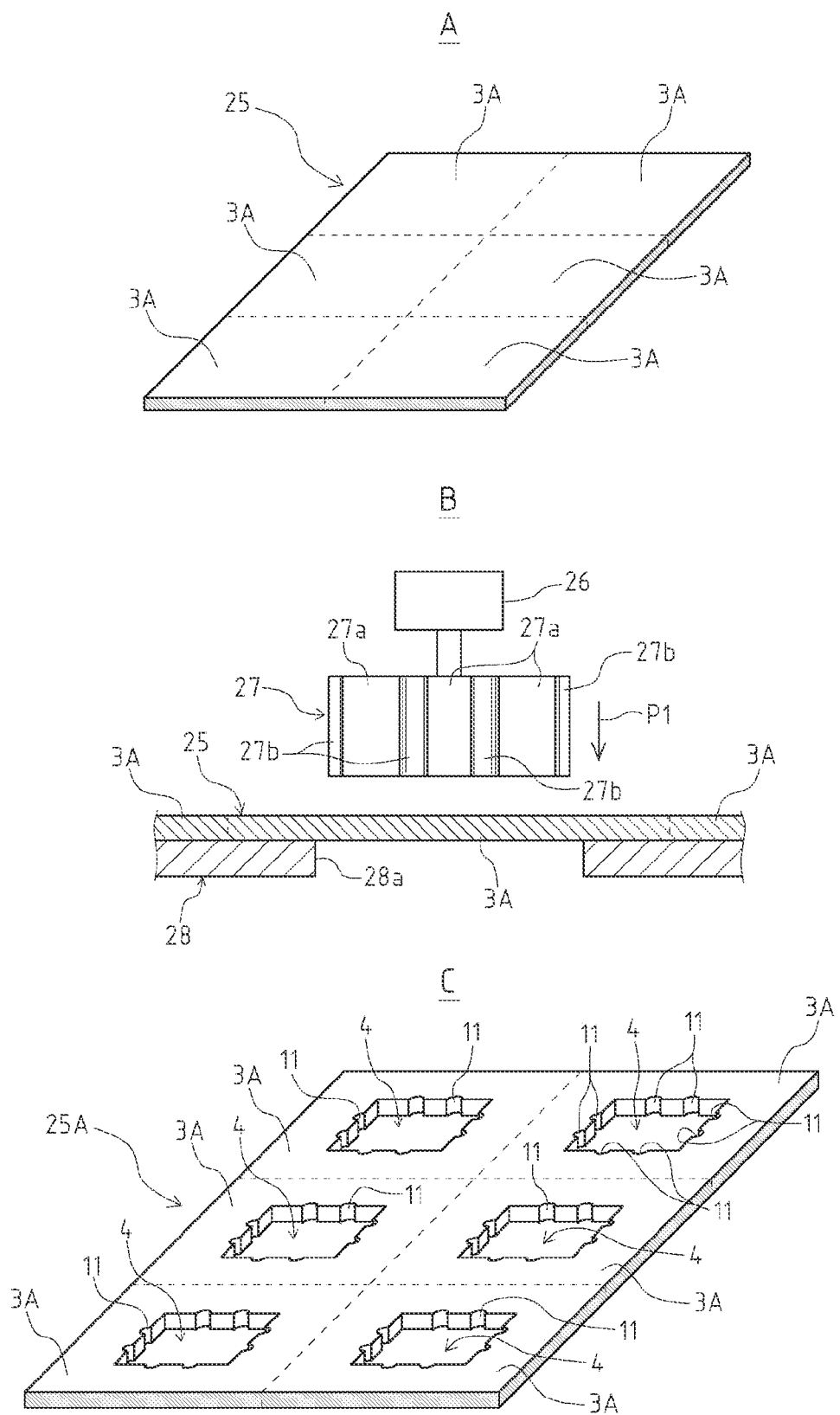
FIG. 10 is an explanatory diagram of a method of manufacturing the solid-state imaging device according to the first embodiment of the present technology.
Figure 11:
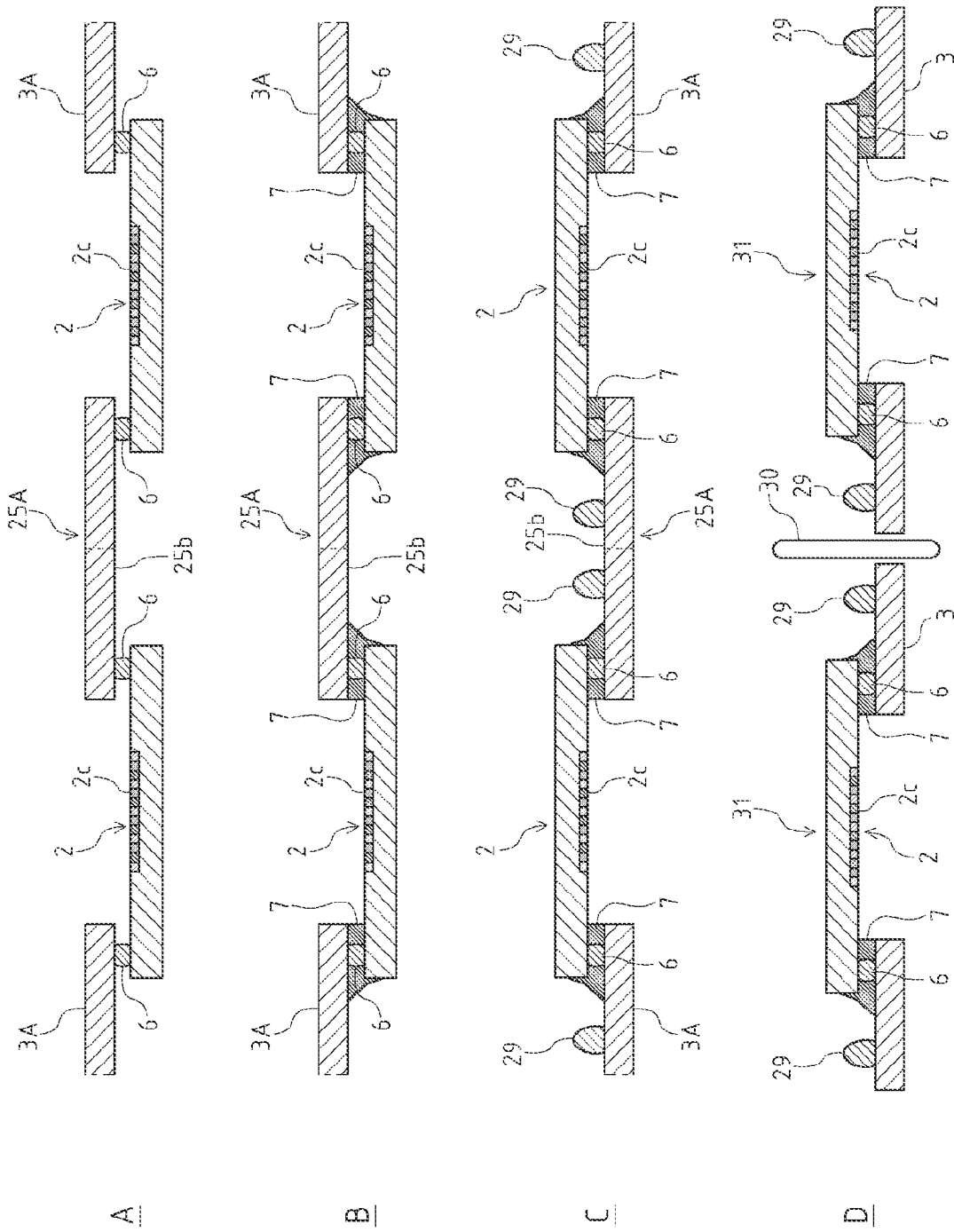
FIG. 11 is an explanatory diagram of a method of manufacturing the solid-state imaging device according to the first embodiment of the present technology.

An example of the manufacturing method of the solid-state imaging device 1 according to the first embodiment of the present technology will be described with reference to FIGS. 9 to 11.

First, as shown in FIG. 9A, a silicon wafer 20 in which the pixel region 2c corresponding to each image sensor 2 is formed on the surface side is prepared. The silicon wafer 20 has undergone various processes for forming the image sensor 2. That is, the silicon wafer 20 is a semiconductor wafer in which a plurality of portions serving as the image sensor 2 in which a pixel group is formed on one plate surface side is formed in a predetermined array. In recent years, 8-inch and 12-inch wafers are mainly used as silicon wafers 20.

As shown in FIG. 9A, for the silicon wafer 20, a back-grinding (BG) process of cutting the silicon wafer 20 from the back surface 20b side in order to make the silicon wafer 20 desired thickness that does not affect the device characteristics. In the BG process, for example, a back grind foil 21 such as a diamond foil is used, and the silicon wafer 20 is polished. Note that, in order to increase the surface roughness of the back surface 20b of the silicon wafer 20, a mirror finishing process such as chemical polishing or dry polishing may be performed after the BG process.

Next, as shown in FIG. 9B, dicing is performed on the silicon wafer 20 along a predetermined dicing line. That is, a process of cutting the silicon wafer 20 so as to divide each portion corresponding to the image sensor 2 along a predetermined array and individualizing the silicon wafer 20 is performed. In the dicing step, the silicon wafer 20 set on a chuck table 22 is divided and individualized by a dicing blade 23 so as to be separated for each image sensor 2. Therefore, the image sensor 2 as a large number of sensor chips is obtained.

Subsequently, as shown in FIG. 9C, a process of forming the metal bump 6 is performed for each image sensor 2. For example, a wire bonding device is used on the electrodes formed on the surface 2a of the image sensor 2, and Au stud bumps as metal bumps 6 are formed. It is desirable that the Au stud bump is as small as possible from the viewpoint of cost reduction, and is formed at a height of, for example, about 20 µm.

On the other hand, the substrate 3 is created in a substrate creation process, which is a process different from the main process flow of the flip-chip structure package including the manufacturing process of the image sensor 2. As shown in FIG. 10A, in the substrate creation step, an aggregate substrate 25 in which a substrate portion 3A, which is the substrate 3 included in the solid-state imaging device 1, is two-dimensionally connected is created. In the drawing, a portion of the aggregate substrate 25 in which six substrate portions 3A are connected is shown. For example, an integral aggregate substrate 25 is formed including several tens to several hundreds of substrate portions 3A.

The aggregate substrate 25 is a substrate formed including a material such as an organic material such as a plastic or ceramics provided with a wiring layer, electrodes, or the like. Therefore, in the substrate creation process, a base material to be the aggregate substrate 25 is prepared, and a wiring process of providing a wiring layer, electrodes, and the like on the base material is performed.

Next, an opening forming process, which is a process of forming the opening 4 for each substrate portion 3A of the aggregate substrate 25, is performed. In the opening forming process, as shown in FIG. 10B, for example, the opening 4 is punched by a punching press machine having a punching head 27 which is a jig for punching which is provided so as to be reciprocally movable by a predetermined drive mechanism 26.

The punching head 27 has a shape corresponding to the opening 4. Therefore, in the punching head 27, the portion acting on the aggregate substrate 25 has a flat surface portion 27a corresponding to the flat surface part 13 of the opening 4 and a protruding portion 27b for forming the groove 11. The protruding portion 27b is a semi-cylindrical ridge part protruding from the flat surface portion 27a corresponding to the flat surface part 13. According to such a punching head 27, the opening 4 having the groove 11 is formed only by punching.

In the punching press machine, in a state where the aggregate substrate 25 is set on a stage 28 having an opening 28a for receiving the punching head 27, when the punching head 27 moves in a direction of approaching a predetermined portion of the substrate portion 3A (see Arrow P1), the substrate portion 3A is punched out and the opening 4 is formed. By the opening forming process, as shown in FIG. 10C, an aggregate opening substrate 25A, which is the aggregate substrate 25 in which the opening 4 is formed in each substrate portion 3A, is obtained.

In the opening forming process, the method as below can be adopted. First, a rectangular opening portion is punched and formed in the substrate portion 3A of the aggregate substrate 25 by a punching press machine having a punching head having a simple rectangular cross section. That is, the flat surface portion serving as the flat surface part 13 in the opening 4 is formed by punching. Thereafter, the groove 11 is formed on the flat surface portion forming the punched opening portion by a processing tool such as a drill. According to such a method, the opening 4 having the groove 11 is formed by a two-step process of a punching step of forming a simple opening portion and a cutting step (groove forming step) of forming the groove 11 in the flat surface portion forming the opening portion.

The aggregate opening substrate 25A is put into the main process of the flip-chip structure package. Then, as shown in FIG. 11A, the image sensor 2 and the aggregate opening substrate 25A are flip-chip bonded. That is, the image sensor 2 is flip-chip mounted on each substrate portion 3A of the aggregate opening substrate 25A so as to close the opening 4 from the back surface 25b side which is the back surface 3b of the substrate 3.

For the flip-chip bonding, a method using a conductive adhesive, a method using a film-type anisotropic conductive film, an ultrasonic bonding method, a pressure welding method, and the like are used as appropriate depending on the type of the metal bump 6. In the state where the image sensor 2 is flip-chip mounted on the aggregate opening substrate 25A, the dimension of the gap between the aggregate opening substrate 25A and the image sensor 2 is, for example, about 20 μm, corresponding to the height of the metal bump 6.

Next, as shown in FIG. 11B, a process of forming the underfill part 7 is performed. In this process, the underfill material is supplied to the gap between each image sensor 2 and the substrate portion 3A (hereinafter, referred to as "sensor-substrate gap") while being discharged from a nozzle of a dispenser (not shown). Here, for example, the underfill material is supplied from the outer peripheral side of the image sensor 2 to the sensor-substrate gap.

The underfill material supplied to the sensor-substrate gap flows into the sensor-substrate gap due to capillarity phenomenon, covers the entire plurality of metal bumps 6, and spreads so as to fill the gap between the image sensor 2 and the substrate 3. Here, on the outer peripheral side of the sensor-substrate gap, the underfill material spreads like a fillet due to its surface tension or the like and protrudes from the sensor-substrate gap portion. Furthermore, between the image sensor 2 and the substrate 3, the underfill material that has reached the open portion on the lower side of the groove 11 is guided onto the concave surface 12 in a manner of climbing up the groove 11 by the capillary phenomenon.

Regarding the viscosity of the underfill material, if the viscosity is too low, the underfill material easily penetrates into the pixel region 2c side, and if the viscosity is too high, penetration in the sensor-substrate gap takes much time. Therefore, as the underfill material, a material of 20 Pa·s or less at room temperature, desirably about 10 Pa·s at room temperature is used.

After the underfill material is supplied to the sensor-substrate gap, baking is performed under predetermined temperature conditions in order to vaporize the solvent contained in the underfill material and solidify the underfill material. The baking temperature is appropriately set according to the underfill material, the solvent contained therein, and the like. As the baking equipment, a hot plate, an oven, and the like are appropriately selected and used as needed. By baking, the underfill material is solidified, and the underfill part 7 having the surface intervening part 7a, the outer protruding part 7b, and the leading out part 7c in the groove 11 is formed (see FIG. 4).

Next, as shown in FIG. 11C, the aggregate opening substrate 25A to which the image sensor 2 is bonded and the underfill part 7 is formed is inverted and marking is performed. In the marking, for example, unique identification information such as a serial number is attached to each substrate portion 3A of the aggregate opening substrate 25A by laser marking or the like.

Next, as shown in FIG. 11C, a process of forming a solder ball 29 is performed at a predetermined portion on the back surface side of each substrate portion 3A of the aggregate opening substrate 25A. The solder ball 29 is formed so as to be electrically connected to the wiring part of the substrate portion 3A, for example, through the opening of a solder resist formed on the back surface side of each substrate portion 3A.

The solder ball 29 is formed by, for example, a method of placing ball-shaped solder in a state where flux is applied to the opening of the solder resist, or a method of printing solder paste on the opening of the solder resist using a printing technique, and then reflowing. The solder ball 29 serves as a terminal for making an electrical connection to a circuit board on which the solid-state imaging device 1 is mounted in a predetermined device to which the solid-state imaging device 1 is applied.

Subsequently, as shown in FIG. 11D, a dicing process is performed in which the aggregate opening substrate 25A on which the image sensor 2 is mounted on each substrate portion 3A is divided and individualized in units of device. In this process, the aggregate opening substrate 25A is divided by the dicing blade 30 and individualized into a plurality of device elements 31 so that the aggregate opening substrate 25A is divided into the substrate portions 3A.

Then, the glass 5 is fixed and mounted on the surface 3a side of the substrate 3 with an adhesive or the like on each of the individualized device elements 31. The solid-state imaging device 1 is obtained by the above manufacturing process. Note that, after mounting the glass 5 on each substrate portion 3A in the state of the aggregate opening substrate 25A, dicing may be performed on the aggregate opening substrate 25A.

According to the solid-state imaging device 1 according to the present embodiment as described above, it is possible to suppress the material forming the underfill part 7 from flowing to the pixel region 2c side of the image sensor 2. Therefore, it is possible to shorten the distance between the opening end portion of the opening 4 of the substrate 3 and the pixel region 2c, that is, the distance in the horizontal direction between the flat surface part 13 forming the opening 4 and an edge of the pixel region 2c facing the flat surface part 13 in a plan view (FIG. 3, interval L1, hereinafter referred to as "distance between the opening end of the substrate and the pixel"). As a result, the image sensor 2 and the solid-state imaging device 1 can be miniaturized.

In a package structure such as the solid-state imaging device 1 according to the present embodiment, in the process of forming the underfill part 7, it is necessary to keep the distance between the opening end of the substrate and the pixel above a certain level in order to prevent the underfill material from flowing into the pixel region 2c. Here, a configuration in which the groove 11 is not provided in the opening 4 of the substrate 3 is assumed as a configuration of a comparative example. That is, in the configuration of the comparative example, a substrate 3X has an opening 4X formed by a flat surface 13X such as the flat surface part 13 as a whole.

Figure 12:
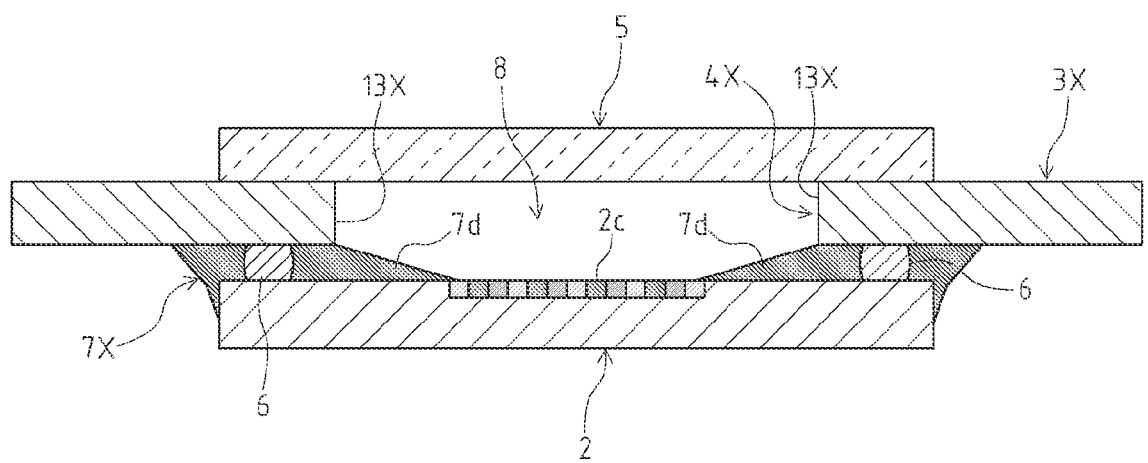
FIG. 12 is an explanatory diagram of a phenomenon that occurs in a configuration of a comparative example for the present technology.

In a case of the configuration of the comparative example, if the distance between the opening end of the substrate and the pixel is insufficient, for example, as shown in FIG. 12, the underfill material penetrates into the pixel region 2c and the characteristics of the image sensor 2 deteriorate. In the example shown in FIG. 12, as a part of an underfill part 7X, an inner protruding part 7d protruding from the sensor-substrate gap to the inner peripheral side is formed, and this inner protruding part 7d covers the edge of the pixel region 2c. As described above, in the prior art, from the viewpoint of avoiding the penetration of the underfill material into the pixel region, it is necessary to secure the distance between the opening end of the substrate and the pixel so that the inner protruding part 7d does not cover the pixel region 2c so that there is a limit to the miniaturization of the sensor chip.

On the other hand, the solid-state imaging device 1 according to the present embodiment has the groove 11 for guiding the underfill material in the opening 4 of the substrate 3. With such a configuration, the underfill material that has penetrated from the application area with respect to the sensor-substrate gap is guided into the groove 11 by the capillary phenomenon, and is guided upward by the groove 11. Therefore, the underfill material is suppressed from advancing toward the pixel region 2c.

That is, in the solid-state imaging device 1 according to the present embodiment, the groove 11 of the opening 4 of the substrate 3 controls the flow of the underfill material from a direction of advancing toward the pixel region 2c (inside) to the direction of climbing up the inner side surface portion 10 of the opening 4, so that the underfill material is suppressed from protruding from the sensor-substrate gap to the pixel region 2c side. Therefore, for example, even if the distance between the opening end of the substrate and the pixel is such that the underfill material reaches the pixel region 2c in the configuration of the comparative example as shown in FIG. 12, by adopting the configuration of the solid-state imaging device 1 of the present embodiment, it is possible to prevent the underfill material from reaching the pixel region 2c. As a result, the distance between the opening end of the substrate and the pixel can be made shorter than before, which can contribute to the miniaturization of the image sensor 2.

Furthermore, regarding the shape of the groove 11, in the present embodiment, the groove 11 is formed by a semi-cylindrical concave curved surface. According to such a configuration, it is easy to secure the surface area of the concave surface 12, and the guiding action of the underfill material can be effectively obtained. Furthermore, the groove 11 can be easily formed by a processing tool such as a drill.

<3. Configuration Example of Solid-State Imaging Device According to the Second Embodiment>

A configuration example of a solid-state imaging device 51 according to a second embodiment of the present technology will be described with reference to FIGS. 13 to 15. Note that, in the description below, the same reference numerals will be given to the configurations common to those of the first embodiment, and the description thereof will be omitted as appropriate. Furthermore, FIG. 13 shows an end view of the cut portion at a position passing through the central portion of a groove 61, as similar to the B-B position passing through the central portion of the groove 11 in FIG. 4.

The solid-state imaging device 51 of the present embodiment is different from the solid-state imaging device 1 of the first embodiment in that the groove 11 of the opening 4 of the substrate 3 is inclined in a predetermined direction.

Figure 13:
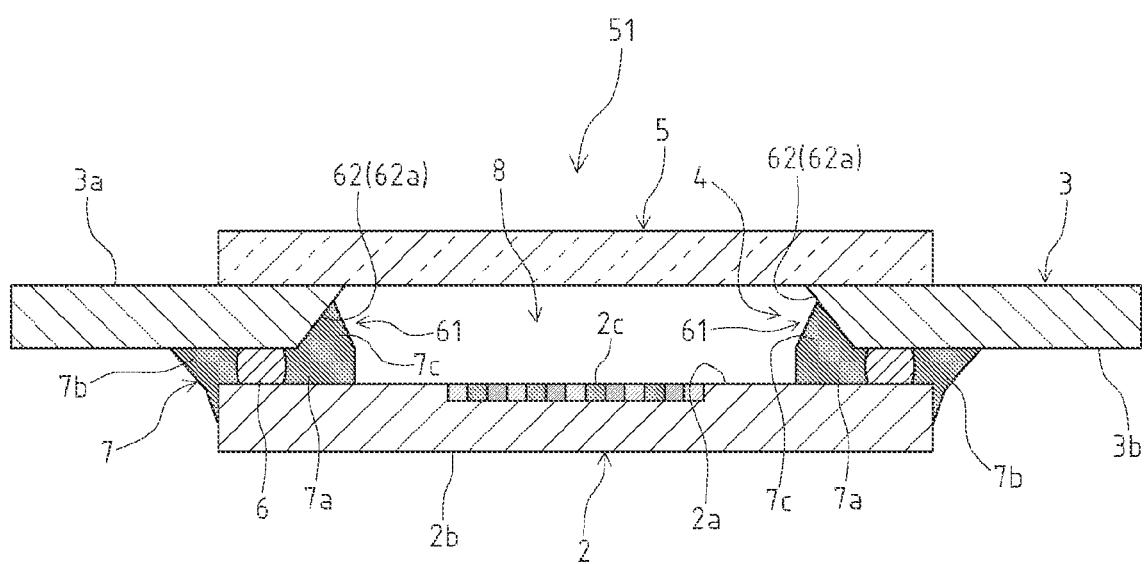
FIG. 13 is a cross-sectional view of a side end face showing a configuration of a solid-state imaging device according to a second embodiment of the present technology.
Figure 14:
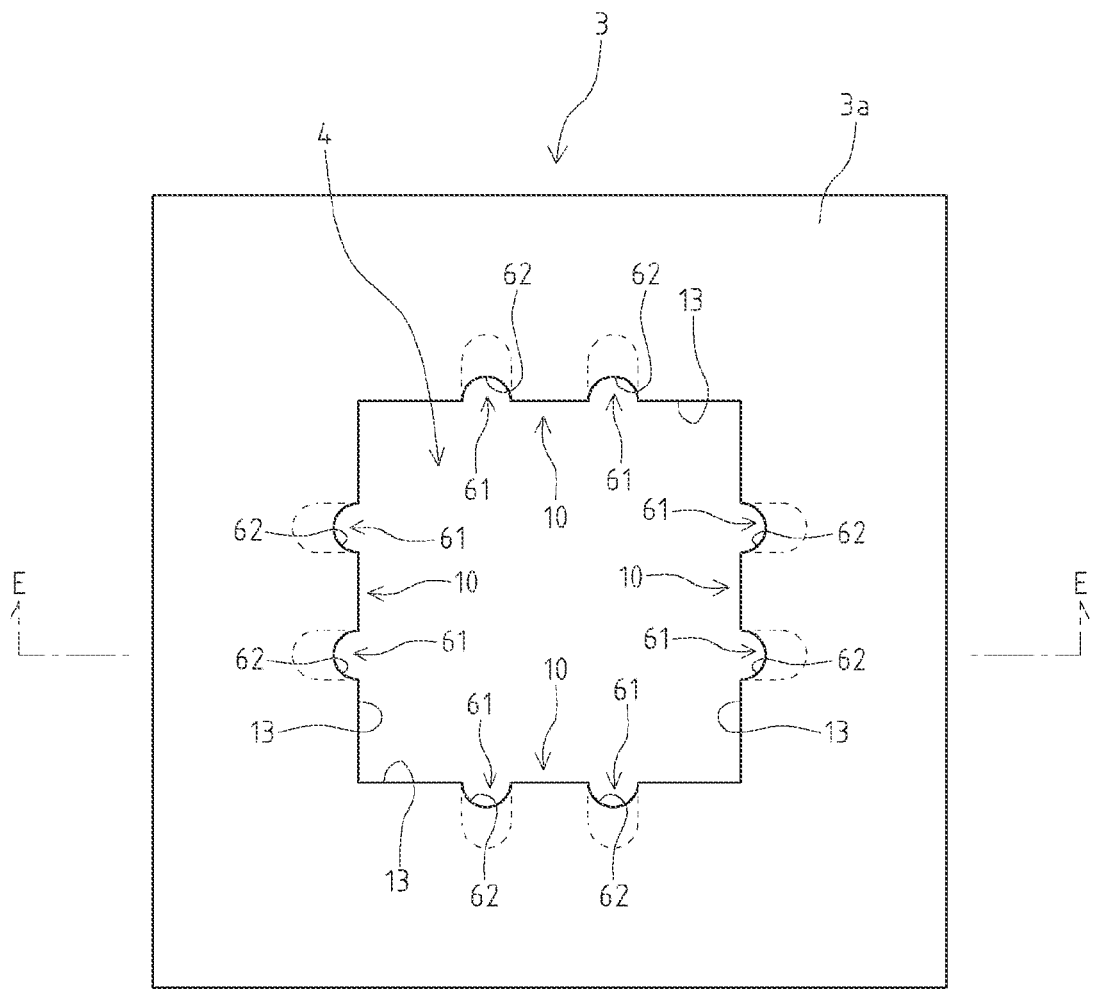
FIG. 14 is a plan view showing the configuration of the substrate according to the second embodiment of the present technology.
Figure 15:
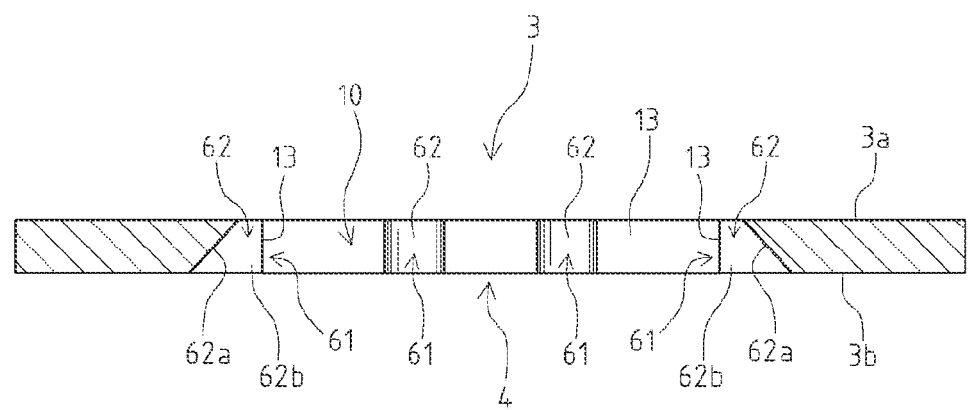
FIG. 15 is a cross-sectional view taken along the line E-E in FIG. 14.

As shown in FIGS. 13 to 15, in the solid-state imaging device 51 of the present embodiment, the groove 61 of the opening 4 of the substrate 3 is inclined in a direction in which the opening width of the opening 4 is narrowed from the image sensor 2 side to the opposite side, with respect to the plate thickness direction (up and down direction in FIG. 15) of the substrate 3.

The groove 61 is formed by a concave surface 62 which is a concave portion with respect to the flat surface part 13 of the inner side surface portion 10. The groove 61 is inclined in a direction from the outside to the inside from the image sensor 2 side (lower side in FIG. 15) to the opposite side (upper side in FIG. 15), that is, a direction in which the opening width of the opening 4 is narrowed, with respect to the plate thickness direction of the substrate 3.

Specifically, the concave surface 62 forming the groove 61 includes a concave curved surface part 62a having a semicircular horizontal cross-sectional shape, and both the front surface 3a side and the back surface 3b side of the substrate 3 are open. In the side sectional view, the concave curved surface part 62a makes a straight line inclined so as to extend from the outside (left and right outside in FIG. 15) which is the outer edge side of the substrate 3 to the inside (left and right inside in FIG. 15) which is the opening part 4 side, from the back surface 3b side to the front surface 3a side of the substrate 3.

Furthermore, the concave surface 62 forming the groove 61 has a flat surface part 62b which is a vertical flat surface at a portion inside the concave curved surface part 62a. The flat surface part 62b is formed at a portion facing the groove 61 in the width direction. Due to the flat surface part 62b, the opening area on the lower side (back surface 3b side) of the groove 61 is larger than the opening area on the upper side (front surface 3a side).

In the method for manufacturing the solid-state imaging device 51 of the present embodiment, in the opening forming process of forming the opening 4 of the substrate 3, for example, the punching process of forming the opening portion by a punching press machine as described above, and a cutting process (groove forming process) of forming the groove 61 in the flat surface portion forming the opening portion by using a processing tool such as a drill are performed. That is, as an opening forming process, after forming a flat surface portion serving as the flat surface part 13 in the opening 4 by punching, the groove 61 is formed on the flat surface portion forming the punched opening portion by a processing tool such as a drill.

According to the solid-state imaging device 51 according to the present embodiment as described above, the actions and effects as below can be obtained in addition to the actions and effects obtained by the solid-state imaging device 1 according to the first embodiment.

That is, in the solid-state imaging device 51 according to the present embodiment, the groove 61 is inclined in a direction in which the opening width of the opening 4 is gradually narrowed from the lower side (image sensor 2 side) to the upper side (glass 5 side). According to such a configuration, by the concave curved surface part 62a forming the inclined surface of the groove 61, an action of damming the underfill material guided upward.

Therefore, it is possible to prevent the underfill material guided by the groove 61 from climbing up the groove 61 and reaching the surface 3a of the substrate 3. That is, by adjusting the inclination angle of the concave curved surface part 62a, it is possible to control the climbing behavior of the underfill material in the groove 61, and prevent the underfill material from reaching the surface 3a of the substrate 3.

Therefore, it is possible to prevent the underfill material from adhering to the surface 3a of the substrate 3 which is the support surface on which the glass 5 is supported, and it is possible to prevent the underfill material from affecting the mounting structure of the glass 5. Note that, in FIG. 13, as a part of the underfill part 7, a leading out part 7c formed including the dammed underfill material in the groove 61 is shown.

<4. Configuration Example of Solid-State Imaging Device According to the Third Embodiment>

A configuration example of a solid-state imaging device 71 according to a third embodiment of the present technology will be described with reference to FIGS. 16 to 19. Note that FIG. 16 shows an end view of the cut portion at a position passing through the central portion of a groove 81, as similar to the B-B position passing through the central portion of the groove 11 in FIG. 4.

In comparison with the solid-state imaging device 1 of the first embodiment, the solid-state imaging device 71 of the present embodiment is different in that a lens unit 73 as an optical system including a plurality of lenses 74 and glasses 75 is provided instead of the glass 5, and the groove 11 of the opening 4 of the substrate 3 is inclined in a predetermined direction.

Figure 16:
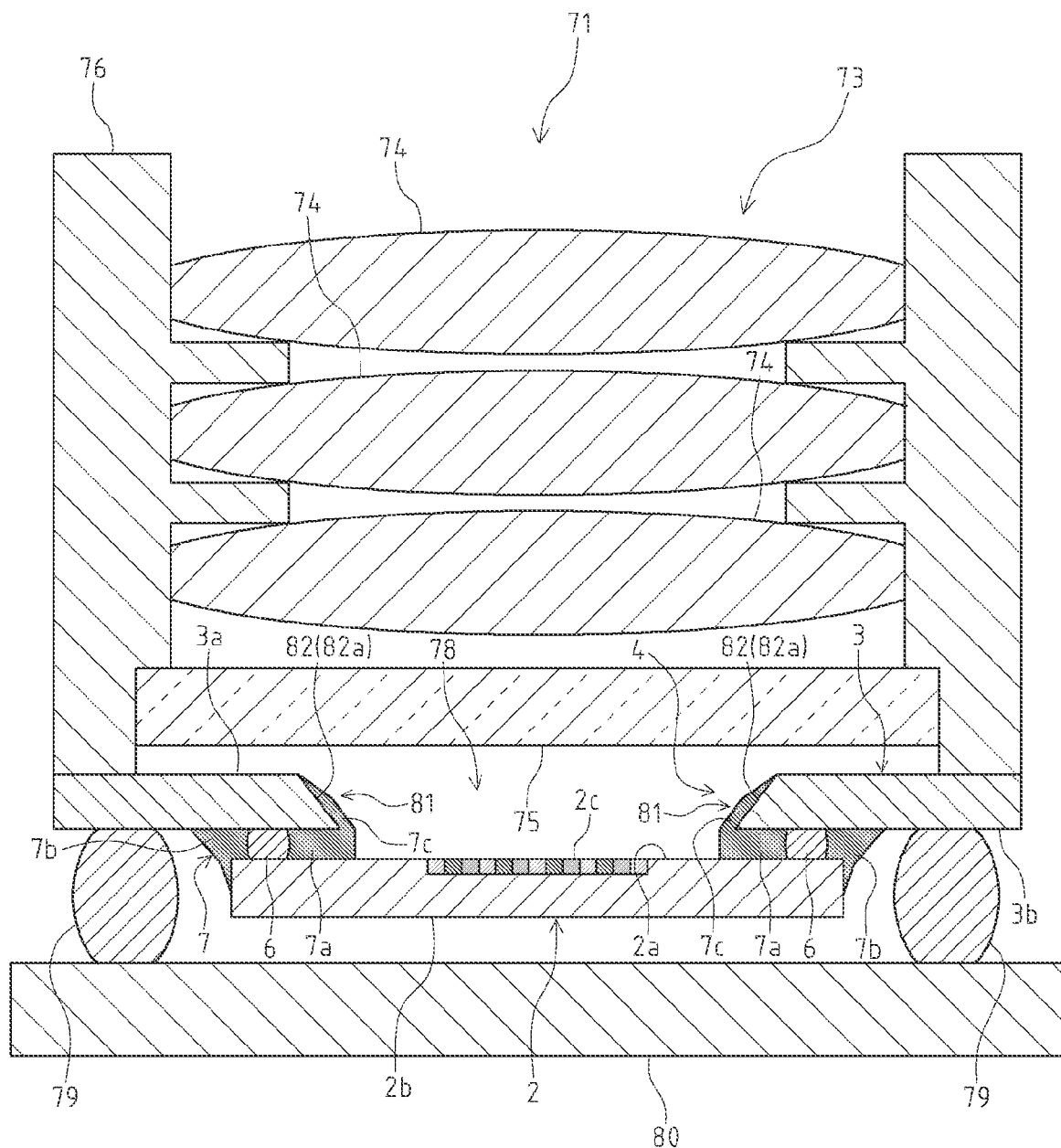
FIG. 16 is a cross-sectional view of a side end face showing a configuration of a solid-state imaging device according to a third embodiment of the present technology.

As shown in FIG. 16, the lens unit 73 is provided on the surface 3a side of the substrate 3, and light from a subject is imaged on the image sensor 2 by the plurality of lenses 74. The lens unit 73 has a support cylinder 76 formed in a tubular shape, and the lenses 74 and the glasses 75 are supported in the support cylinder 76. In the present embodiment, the support cylinder 76 supports three lenses 74 in a state where the three lenses 74 are stacked in the up and down direction via a spacer or the like so that the cylinder axis direction is the optical axis direction. The glass 75 is supported below the lowermost lens 74 and at the lower end portion of the support cylinder 76. Note that the number of lenses 74 is not particularly limited.

The lens unit 73 is provided on the substrate 3 so that the optical axis direction is perpendicular (up and down direction) to the plate surface of the image sensor 2. The lens unit 73 is mounted on the substrate 3 in a state where the lower end portion of the support cylinder 76 is fixed and supported on the outer peripheral portion of the surface 3a of the substrate 3 with an adhesive or the like. The glass 75 is an example of a transparent member as similar to the glass 5 of the first embodiment, and is provided in parallel to the image sensor 2 and at a position separated by a predetermined interval with respect to the surface 3a of the substrate 3 so as to cover the entire opening 4 from above, in a state of being supported by the lens unit 73.

In the package structure of the present embodiment, a cavity 78 which is a closed space including the internal space of the opening 4 of the substrate 3 is formed by the image sensor 2, the underfill part 7, the substrate 3, the glass 75, and the lower end portion of the support cylinder 76. In such a configuration, light collected by the plurality of lenses 74 passes through the glass 75 and is incident on the light receiving surface of the image sensor 2 through the cavity 78. Furthermore, the solid-state imaging device 71 according to the present embodiment is used, for example, as shown in FIG. 16, by being mounted on a circuit board 80 including an organic material such as plastic or ceramics via a solder ball 79 arranged at a predetermined portion on the back surface 3b side of the substrate 3.

Figure 17:
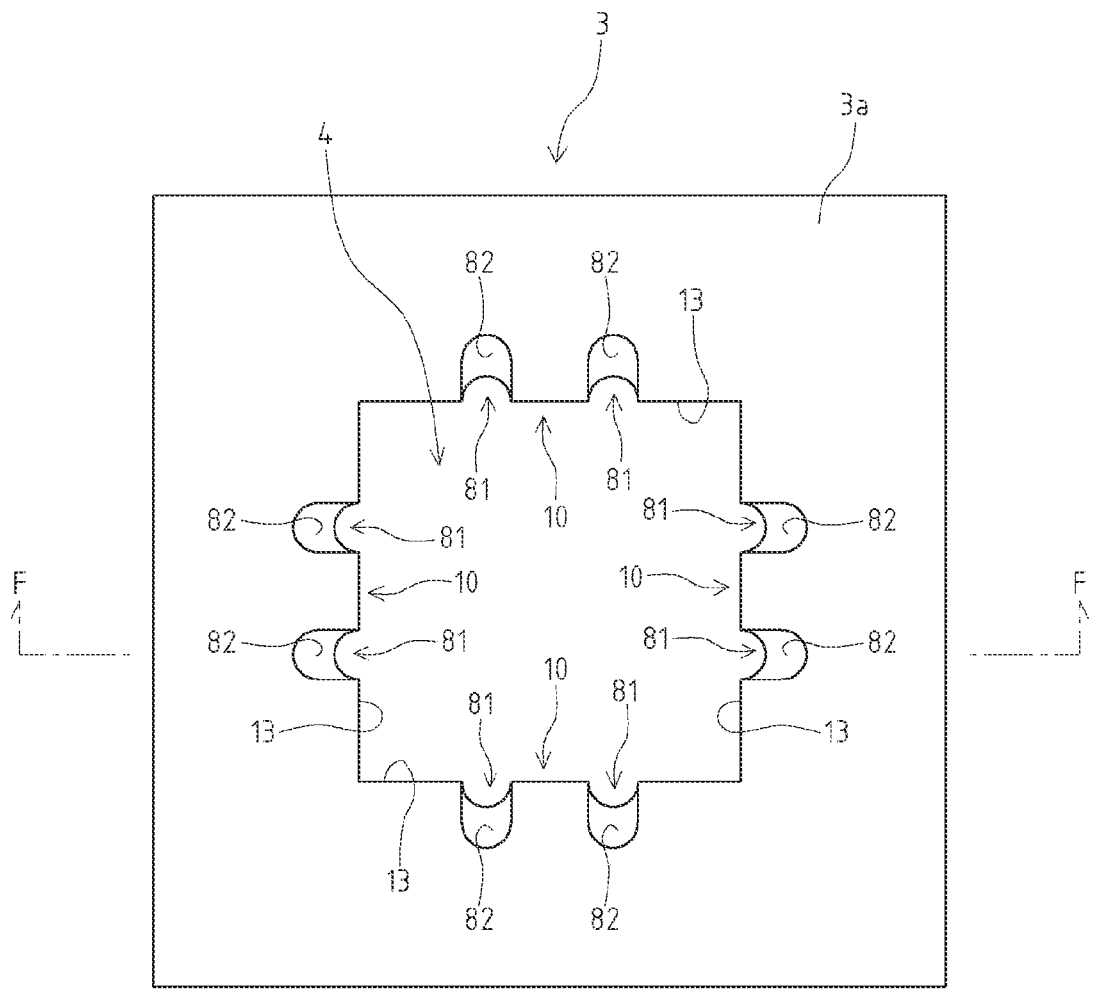
FIG. 17 is a plan view showing the configuration of the substrate according to the third embodiment of the present technology.
Figure 18:
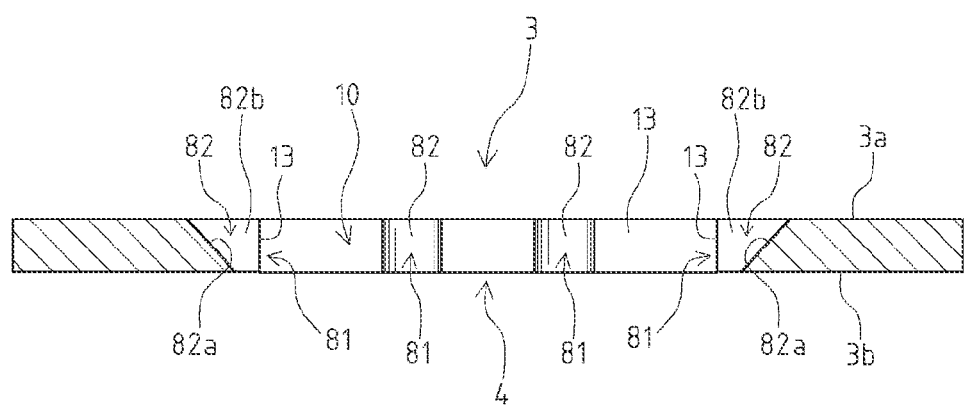
FIG. 18 is a cross-sectional view taken along the line F-F in FIG. 17.

Next, the groove 81 of the substrate 3 according to the present embodiment will be described. As shown in FIGS. 16 to 18, in the solid-state imaging device 71 of the present embodiment, the groove 81 of the opening 4 of the substrate 3 is inclined in a direction in which the opening width of the opening 4 is widened from the image sensor 2 side to the opposite side, with respect to the plate thickness direction (up and down direction in FIG. 18) of the substrate 3.

The groove 81 is formed by a concave surface 82 which is a concave portion with respect to the flat surface part 13 of the inner side surface portion 10. The groove 81 is inclined in a direction from the inside to the outside from the image sensor 2 side (lower side in FIG. 18) to the opposite side (upper side in FIG. 18), that is, a direction in which the opening width of the opening 4 is widened, with respect to the plate thickness direction of the substrate 3.

Specifically, the concave surface 82 forming the groove 81 includes a concave curved surface part 82a having a semicircular horizontal cross-sectional shape, and both the front surface 3a side and the back surface 3b side of the substrate 3 are open. In the side sectional view, the concave curved surface part 82a makes a straight line inclined so as to extend from the inside (left and right inside in FIG. 18) which is the opening 4 side of the substrate 3 to the outside (left and right outside in FIG. 18) which is the outer edge side, from the back surface 3b side to the front surface 3a side of the substrate 3.

Furthermore, the concave surface 82 forming the groove 81 has a flat surface part 82b which is a vertical flat surface at a portion inside the concave curved surface part 82a. The flat surface part 82b is formed at a portion facing the groove 81 in the width direction. Due to the flat surface part 82b, the opening area on the lower side (back surface 3b side) of the groove 81 is smaller than the opening area on the upper side (front surface 3a side).

In the method for manufacturing the solid-state imaging device 71 of the present embodiment, in the opening forming process of forming the opening 4 of the substrate 3, as similar to the case of the second embodiment, for example, the punching process of forming the opening portion by a punching press machine as described above, and a cutting process (groove forming process) of forming the groove 81 in the flat surface portion forming the opening portion by using a processing tool such as a drill are performed. Furthermore, in the main process of the package, a process of mounting the lens unit 73 on the substrate 3 is performed as a process before or after the dicing process for the aggregate opening substrate 25A.

According to the solid-state imaging device 71 according to the present embodiment as described above, the actions and effects as below can be obtained in addition to the actions and effects obtained by the solid-state imaging device 1 according to the first embodiment.

That is, in the solid-state imaging device 71 according to the present embodiment, the groove 81 is inclined in a direction in which the opening width of the opening 4 is gradually widened from the lower side (image sensor 2 side) to the upper side (glass 75 side). According to such a configuration, the flow path cross-sectional area of the groove 81 gradually increases from the lower side to the upper side, so that it is possible to prevent the underfill material guided in the manner of climbing up in the groove 81 from accumulating in the groove 81. That is, by adjusting the inclination angle of the concave curved surface part 82a, it is possible to control the climbing behavior of the underfill material in the groove 81, and prevent the underfill material from accumulating in the groove 81.

Therefore, it is possible to prevent the underfill material from accumulating in the groove 81 and solidifying in a state of bulging to the outside of the groove 81 due to surface tension or the like. There is a possibility that the underfill portion that bulges outward from the groove 81 becomes an inwardly protruding portion in the opening 4 of the substrate 3, blocks the light received by the pixel region 2c through the opening 4, and affects the sensor characteristics of the image sensor 2. Therefore, as described above, the inclination of the groove 81 prevents the accumulation of the underfill material in the groove 81, so that the protruding portion of the underfill portion from the groove 81 is less likely to be formed, and it is possible to reduce or prevent affection to the sensor characteristics by the underfill portion.

Furthermore, the solid-state imaging device 71 according to the present embodiment has a configuration in which the lens unit 73 supporting the glass 75 is mounted on the substrate 3 in a state where the lower end portion of the support cylinder 76 is supported on the outer peripheral portion of the surface 3a of the substrate 3. According to such a configuration, for example, unlike the case of the configuration in which the glass 5 is mounted so as to cover the opening 4 of the substrate 3 as in the solid-state imaging device 1 of the first embodiment, it is possible to allow the underfill material to reach the surface 3a of the substrate 3.

Figure 19:
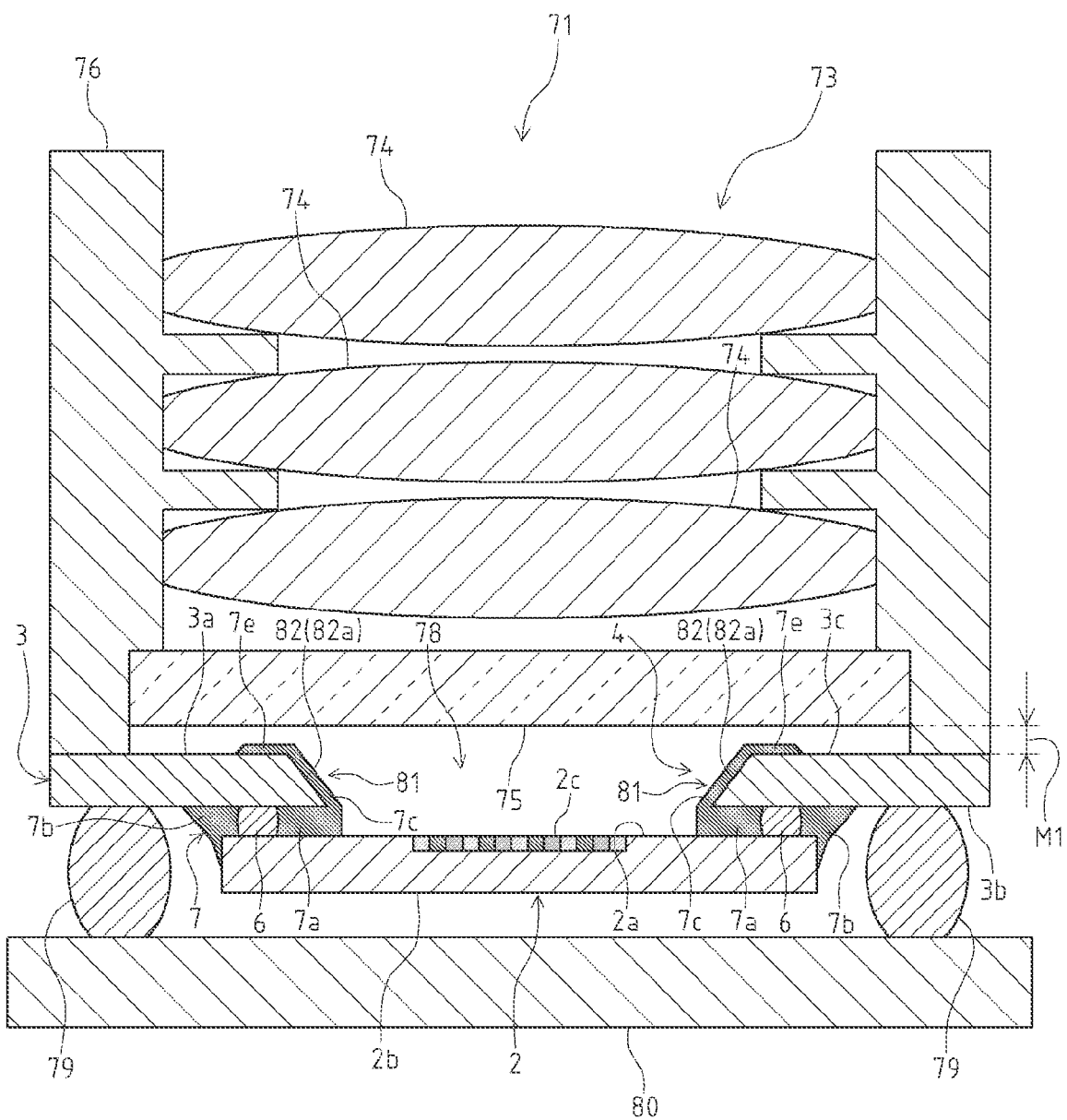
FIG. 19 is an explanatory diagram of action and effect in the solid-state imaging device according to the third embodiment of the present technology.

Specifically, as shown in FIG. 19, the glass 75 supported by the support cylinder 76 supported on the outer peripheral portion of the surface 3a of the substrate 3 is supported around the opening 4 on the surface 3a of the substrate 3 in a state of being spaced with a space M1 between the glass 75 and the surface 3a of the substrate 3. Therefore, the underfill material can be adhered to the facing portion 3c of the surface 3a of the substrate 3 to the glass 75 (particularly the portion around the opening 4) without affecting the mounting structure of the glass 75. That is, the underfill material is allowed to reach the surface 3a of the substrate 3.

Therefore, for example, as shown in FIG. 19, in the underfill part 7, it is possible to form, in addition to the surface intervening part 7a, the outer protruding part 7b, and the leading out part 7c in the groove 81, a riding part 7e formed by cured underfill material that has reached the surface 3a of the substrate 3 as an extending portion from the leading out part 7c. Therefore, for example, by intentionally forming the riding part 7e by adjusting the inclination angle of the groove 81, it is possible to guide more underfill material in the direction away from the pixel region 2c side, and avoid the underfill material reaching the pixel region 2c. Note that, even in the substrates 3 having the grooves 11 and 61 according to the first and second embodiments, by providing the lens unit 73 instead of the glass 5 in the solid-state imaging devices 1 and 51, it is possible to form the riding part 7e in the underfill part 7, and the above-mentioned effect can be obtained.

<5. Modification of Groove of Substrate>

A modification of the groove of the substrate 3 according to the embodiment of the present technology will be described.

As shown in FIG. 20A, the groove 11A of the first modification has a V-shaped horizontal cross-section. The groove 11A is formed by a pair of inclined surfaces 91a having a V-shaped cross-section. That is, the groove 11A is a concave portion formed in a V notch shape.

As shown in FIG. 20B, the groove 11B of a second modification has a horizontal cross-sectional shape along a rectangular shape. The groove 11B is formed by a bottom surface 92a having a cross-sectional shape along a rectangular shape and a pair of side surfaces 92b facing each other.

As shown in FIG. 20C, in the third modification, a groove 11C, which is a V-notch-shaped concave portion formed by pair of inclined surfaces 93a, is continuously formed, and each inner side surface portion 10 forming the rectangular opening 4 is formed in a triangular wave shape. In this configuration, the portion between the adjacent grooves 11C is a ridge portion 93c having a mountain shape in a plan view.

As shown in FIG. 20D, in a fourth modification, a groove 11D, which is a concave portion along a rectangular shape formed by a bottom surface 94a and a pair of side surfaces 94b, is continuously formed, and each inner side surface portion 10 forming the rectangular opening 4 is formed in a rectangular wave shape. In this configuration, the portion between the adjacent grooves 11C is a ridge portion 94c along the rectangular shape in a plan view.

The grooves of each of the modifications shown in FIGS. 20A to 20D are formed perpendicular to the plate surface of the substrate 3 over the entire plate thickness direction of the substrate 3, but the grooves of these modifications may be formed so as to be inclined with respect to the plate thickness direction of the substrate 3 as the groove 61 of the second embodiment and the groove 81 of the third embodiment.

As shown in FIG. 21A, a groove 11E of a fifth modification is formed by a concave surface 95 forming a curved line with the left and right outer sides as convex sides in a side sectional view. As described above, the groove according to the present technology may be formed in a curved shape in the plate thickness direction of the substrate 3. The concave surface 95 is, for example, a semi-cylindrical concave curved surface whose axial direction is the lateral direction (direction along the plate surface of the substrate 3).

As shown in FIG. 21B, a groove 11F of a sixth modification is formed by a concave surface 96 that is curved in the plate thickness direction of the substrate 3 in a side sectional view. Moreover, the concave surface 96 is inclined in the direction in which the opening width of the opening 4 is narrowed from the lower side to the upper side in the plate thickness direction of the substrate 3, as the groove 61 of the second embodiment.

As shown in FIG. 21C, a groove 11G of a seventh modification is formed by a concave surface 97 that is curved in the plate thickness direction of the substrate 3 in a side sectional view. Moreover, the concave surface 97 is inclined in the direction in which the opening width of the opening 4 is widened from the lower side to the upper side in the plate thickness direction of the substrate 3, as the groove 81 of the third embodiment.

The above-mentioned actions and effects can also be obtained by the various modifications described above. In particular, according to the configuration of the sixth modification as shown in FIG. 21B, the similar actions and effects as those of the configuration of the second embodiment can be obtained from the inclination direction of the groove 11F. Furthermore, according to the configuration of the seventh modification as shown in FIG. 21C, the similar actions and effects as those of the configuration of the third embodiment can be obtained from the inclination direction of the groove 11G.

<6. Configuration Example of Electronic Device>

An example of application of the solid-state imaging device according to the above-described embodiment to an electronic device will be described with reference to FIG. 22. Note that, here, an application example of the solid-state imaging device 1 according to the first embodiment will be described.

The solid-state imaging device 1 can be applied to all electronic devices using a solid-state imaging element in an image capture part (photoelectric conversion part) such as an imaging device such as a digital still camera or a video camera, a portable terminal device having an imaging function, and a copier that uses a solid-state imaging element in an image reader. The solid-state imaging element may be in the form of one chip, or may be in the form of a module having an imaging function in which an imaging part and a signal processing part or an optical system are packaged together.

Figure 22:
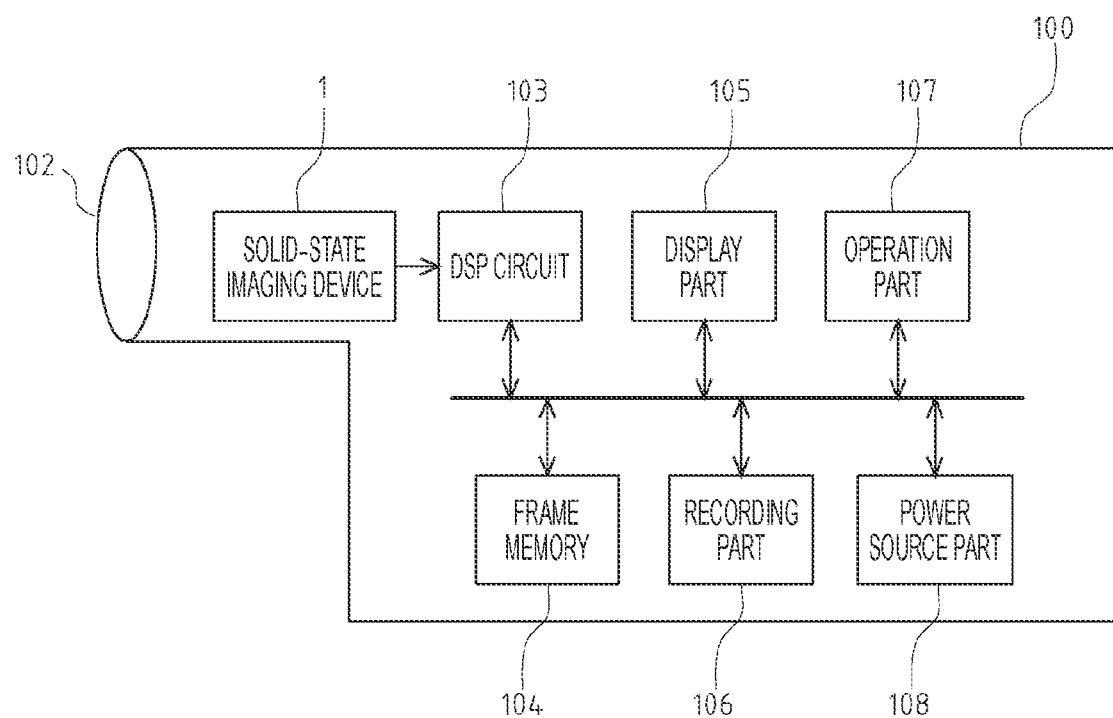
FIG. 22 is a block diagram showing a configuration example of an electronic device provided with a solid-state imaging device according to the embodiment of the present technology.

As shown in FIG. 22, an imaging device 100 as an electronic device includes an optical part 102, a solid-state imaging device 1, a digital signal processor (DSP) circuit 103 which is a camera signal processing circuit, a frame memory 104, a display part 105, a recording part 106, an operation part 107, and a power supply part 108. The DSP circuit 103, the frame memory 104, the display part 105, the recording part 106, the operation part 107, and the power supply part 108 are connected to each other via a bus line 109.

The optical part 102 includes a plurality of lenses, captures incident light (image light) from a subject, and forms an image on the imaging surface of the solid-state imaging device 1. The solid-state imaging device 1 converts the light amount of the incident light formed as the image on the imaging surface by the optical part 102 into an electric signal in units of pixels, and outputs the electric signal as a pixel signal.

The display part 105 includes a panel-type display device such as a liquid crystal display panel or an organic electro luminescence (EL) panel, and displays a moving image or a still image captured by the solid-state imaging device 1. The recording part 106 records the moving image or still image captured by the solid-state imaging device 1 on a recording medium such as a hard disk or a semiconductor memory.

The operation part 107 issues operation commands for various functions of the imaging device 100 under the operation of the user. The power supply part 108 appropriately supplies various power supplies serving as operation power supplies of the DSP circuit 103, the frame memory 104, the display part 105, the recording part 106, and the operation part 107 to these supply targets.

According to the imaging device 100 as described above, in the solid-state imaging device 1, it is possible to prevent the underfill material from flowing to the pixel region 2c side of the image sensor 2, shorten the distance between the opening end of the substrate and the pixels, and promote miniaturization of the image sensor 2 and the solid-state imaging device 1, and also miniaturization of the imaging device 100.

The description of each of the above-described embodiments is an example of the present technology, and the present technology is not limited to the above-described embodiments. For this reason, it is of course that various modifications can be made according to the design and the like, other than the above-described embodiments, as long as the modifications do not depart from the technical idea according to the present disclosure. Furthermore, the effects described in the present disclosure are merely examples and are not intended to be limiting, and other effects may be provided. Furthermore, the configurations of the above-described embodiments and the configurations of the modifications can be appropriately combined.

Note that the present technology can adopt the following configuration.

(1)

A solid-state imaging device including:

a solid-state imaging element having a pixel region which is a light receiving region including a large number of pixels on a surface side which is one plate surface of a semiconductor substrate;

a substrate provided on the surface side with respect to the solid-state imaging element and having an opening for passing light to be received by the pixel region; and an underfill part formed including a cured fluid and covering a connection part that electrically connects the solid-state imaging element and the substrate, in which the substrate has a groove for guiding the fluid forming the underfill part in a direction away from the surface of the solid-state imaging element, on a surface portion forming the opening.

(2)

The solid-state imaging device according to (1) described above, in which the groove is formed by a semi-cylindrical concave curved surface.

(3)

The solid-state imaging device according to (1) or (2) described above, in which the groove is inclined in a direction in which an opening width of the opening is narrowed from a side of the solid-state imaging element to the opposite side with respect to a plate thickness direction of the substrate.

(4)

The solid-state imaging device according to (1) or (2) described above, in which the groove is inclined in a direction in which an opening width of the opening is widened from a side of the solid-state imaging element to the opposite side with respect to a plate thickness direction of the substrate.

(5)

An electronic device including a solid-state imaging device, the solid-state imaging device including:

a solid-state imaging element having a pixel region which is a light receiving region including a large number of pixels on a surface side which is one plate surface of a semiconductor substrate;

a substrate provided on the surface side with respect to the solid-state imaging element and having an opening for passing light to be received by the pixel region; and an underfill part formed including a cured fluid and covering a connection part that electrically connects the solid-state imaging element and the substrate, in which the substrate has a groove for guiding the fluid forming the underfill part in a direction away from the surface of the solid-state imaging element, on a surface portion forming the opening.

REFERENCE SIGNS LIST

1 Solid-state imaging device
2 Image sensor (solid-state imaging element)
2a Surface
2c Pixel region
3 Substrate
4 Opening
5 Glass
6 Metal bump (connection part)
7 Underfill part
7a Surface intervening part
7b Outer protruding part
7c Leading out part
10 Inner side surface portion
11 Groove
12 Concave surface
51 Solid-state imaging device
61 Groove
62 Concave surface
71 Solid-state imaging device
73 Lens unit
81 Groove
82 Concave surface

The invention claimed is:

1. A solid-state imaging device comprising:
a solid-state imaging element having a pixel region which is a light receiving region including a large number of pixels on a surface side which is one plate surface of a semiconductor substrate;

a substrate provided on the surface side with respect to the solid-state imaging element and having an opening for passing light to be received by the pixel region; and an underfill part formed including a cured fluid and covering a connection part that electrically connects the solid-state imaging element and the substrate, wherein the substrate has a groove for guiding the fluid forming the underfill part in a direction away from the surface of the solid-state imaging element, on a surface portion forming the opening.

2. The solid-state imaging device according to claim 1, wherein the groove is formed by a semi-cylindrical concave curved surface.

3. The solid-state imaging device according to claim 1, wherein the groove is inclined in a direction in which an opening width of the opening is narrowed from a side of the solid-state imaging element to the opposite side with respect to a plate thickness direction of the substrate.

4. The solid-state imaging device according to claim 1, wherein the groove is inclined in a direction in which an opening width of the opening is widened from a side of the solid-state imaging element to the opposite side with respect to a plate thickness direction of the substrate.

5. An electronic device comprising a solid-state imaging device, the solid-state imaging device including:

a solid-state imaging element having a pixel region which is a light receiving region including a large number of pixels on a surface side which is one plate surface of a semiconductor substrate;

a substrate provided on the surface side with respect to the solid-state imaging element and having an opening for passing light to be received by the pixel region; and an underfill part formed including a cured fluid and covering a connection part that electrically connects the solid-state imaging element and the substrate, wherein the substrate has a groove for guiding the fluid forming the underfill part in a direction away from the surface of the solid-state imaging element, on a surface portion forming the opening.

\* \* \* \* \*